(12) United States Patent
Tang et al.

(10) Patent No.: US 12,021,535 B1
(45) Date of Patent: Jun. 25, 2024

(54) SIGNAL MODULATION CIRCUIT FOR SOLID STATE ELECTRONIC DEVICE AND CIRCUIT INCORPORATING THE SAME

(71) Applicant: City University of Hong Kong, Kowloon (HK)

(72) Inventors: Ho Tin Tang, Kowloon (HK); Shu Hung Henry Chung, Kowloon (HK)

(73) Assignee: City University of Hong Kong, Kowloon (HK)

( * ) Notice: Subject to any disclaimer, the term of this patent is extended or adjusted under 35 U.S.C. 154(b) by 34 days.

(21) Appl. No.: 18/160,427

(22) Filed: Jan. 27, 2023

(51) Int. Cl.
| H03K 7/02 | (2006.01) |
| H03K 3/037 | (2006.01) |
| H03K 5/24 | (2006.01) |
| H03K 17/687 | (2006.01) |

(52) U.S. Cl.
CPC .............. *H03K 7/02* (2013.01); *H03K 3/037* (2013.01); *H03K 5/2472* (2013.01); *H03K 17/687* (2013.01)

(58) Field of Classification Search
CPC ....................................................... H03K 7/02
USPC ......................................................... 327/109
See application file for complete search history.

(56) References Cited

U.S. PATENT DOCUMENTS

| 2018/0331633 | A1* | 11/2018 | Chung | ................. | H03K 17/163 |
| 2019/0081571 | A1* | 3/2019 | Chung | .................... | G05F 1/575 |

OTHER PUBLICATIONS

J. Wang, H. Chung, and T. Li, "Characterization and experimental assessment of the Effects of Parasitic Elements on the MOSFET Switching Performance," IEEE Transactions on Power Electronics, vol. 28, No. 1, pp. 573-590, Jan. 2013.

J. Wang and H. Chung, "Impact of Parasitic Elements on the Spurious Triggering Pulse in Synchronous Buck Converter," IEEE Transactions on Power Electronics, vol. 29, No. 12, pp. 6672-6685, Dec. 2014.

N. Sakib, M. Manjrekar and A. Ebong, "An overview of advances in high reliability gate driving mechanisms for SiC MOSFETs," in Proceeding of 2017 IEEE 5th Workshop on Wide Bandgap Power Devices and Applications (WiPDA), Albuquerque, NM, 2017, pp. 291-294.

(Continued)

*Primary Examiner* — Tomi Skibinski
(74) *Attorney, Agent, or Firm* — Renner, Kenner, Greive, Bobak, Taylor & Weber

(57) ABSTRACT

A circuit includes a first and a second solid state electronic device arranged in a bridge-leg configuration, each selectively operable as a control switch and synchronous switch and each selectively operable in an ON state and OFF state. A driver circuit is operably connected with at least the first solid state electronic device for controlling operation of at least the first solid state electronic device. A signal modulation circuit is operably connected with or between the driver circuit and the first solid state electronic device and includes an input operably connected with the driver circuit, an output operably connected with the first solid state electronic device, and a variable resistance circuit operably connected between the input and the output and operably connected with the driver circuit. A resistance of the variable resistance circuit is adjustable by the driver circuit to prevent spurious operation of the first solid state electronic device.

29 Claims, 27 Drawing Sheets

(56) References Cited

OTHER PUBLICATIONS

J. Millán, P. Godignon, X. Perpiñà, A. Pérez-Tomás and J. Rebollo, "A Survey of Wide Bandgap Power Semiconductor Devices," IEEE Transactions on Power Electronics, vol. 29, No. 5, pp. 2155-2163, May 2014.

S. Jahdi, O. Alatise, J. O. Gonzalez, L. Ran and P. Mawby, "Comparative analysis of false turn-ON in silicon bipolar and SiC unipolar power devices," in Proceeding of 2015 IEEE Energy Conversion Congress and Exposition (ECCE), Montreal, QC, 2015, pp. 2239-2246.

R. Xie, H. Wang, G. Tang, X. Yang and K. Chen, "An Analytical Model for False Turn-On Evaluation of High-Voltage Enhancement-Mode GaN Transistor in Bridge-Leg Configuration," IEEE Transactions on Power Electronics, vol. 32, No. 8, pp. 6416-6433, Aug. 2017.

"Compound Gate Driver With Negative Output Voltage Capability," Datasheet of LM5110, Texas Instruments, Sep. 2016.

Q. Qian, J. Yu, J. Zhu, W. Sun, and Y. Yi, "Isolated gate driver for SiC MOSFETs with constant negative off voltage," in Proceeding of 2017 IEEE Applied Power Electronics Conference and Exposition (APEC), Tampa, FL, 2017, pp. 1990-1993.

P. V. Pol, S. L. Patil and S. K. Pandey, "A simple and novel technique for driving silicon carbide power MOSFETs with unipolar supply voltage," in Proceeding of 2016 IEEE International Conference on Power Electronics, Drives and Energy Systems (PEDES), Trivandrum, 2016, pp. 1-6.

Q. Zhou, F. Gao and T. Jiang, "A gate driver of SiC MOSFET with passive triggered auxiliary transistor in a phase-leg configuration," in Proceeding of 2015 IEEE Energy Conversion Congress and Exposition (ECCE), Montreal, QC, 2015, pp. 7023-7030.

J. Wang and H. Chung, "A Novel RCD Level Shifter for Elimination of Spurious Turn-on in the Bridge-Leg Configuration," IEEE Transactions on Power Electronics, vol. 30, No. 2, pp. 976-984, Feb. 2015.

A. Lemmon, M. Mazzola, J. Gafford, and C. Parker, "Instability in Half-Bridge Circuits Switched With Wide Band-Gap Transistors," IEEE Transactions on Power Electronics, vol. 29, No. 5, pp. 2380-2392, May 2014.

Z. Zhang et al., "Impact of ringing on switching losses of wide band-gap devices in a phase-leg configuration," in Proceeding of 2014 IEEE Applied Power Electronics Conference and Exposition—APEC 2014, Fort Worth, TX, 2014, pp. 2542-2549.

S. Jahdi, O. Alatise, J. A. Ortiz Gonzalez, R. Bonyadi, L. Ran and P. Mawby, "Temperature and Switching Rate Dependence of Crosstalk in Si-IGBT and SiC Power Modules," IEEE Transactions on Industrial Electronics, vol. 63, No. 2, pp. 849-863, Feb. 2016.

Z. Zhang, F. Wang, L. Tolbert, and B. Blalock, "Active Gate Driver for Crosstalk Suppression of SiC Devices in a Phase-Leg Configuration," IEEE Transactions on Power Electronics, vol. 29, No. 4, pp. 1986-1997, Apr. 2014.

Y. Li, M. Liang, J. Chen, T. Q. Zheng and H. Guo, "A Low Gate Turn-OFF Impedance Driver for Suppressing Crosstalk of SiC MOSFET Based on Different Discrete Packages," in IEEE Journal of Emerging and Selected Topics in Power Electronics, vol. 7, No. 1, pp. 353-365, Mar. 2019.

K. Yamaguchi, K. Katsura, T. Yamada and Y. Sato, "Comprehensive evaluation of gate boost driver for SiC-MOSFETs," 2016 IEEE Energy Conversion Congress and Exposition (ECCE), Milwaukee, WI, 2016, pp. 1-8.

S. Zhao, X. Zhao, A. Dearien, Y. Wu, Y. Zhao and H. A. Mantooth, "An Intelligent Versatile Model-Based Trajectory-Optimized Active Gate Driver for Silicon Carbide Devices," in IEEE Journal of Emerging and Selected Topics in Power Electronics, vol. 8, No. 1, pp. 429-441, Mar. 2020.

C. DiMarino, W. Zhang, N. Haryani, Q. Wang, R. Burgos and D. Boroyevich, "A high-density, high-efficiency 1.2 kV SiC MOSFET module and gate drive circuit," 2016 IEEE 4th Workshop on Wide Bandgap Power Devices and Applications (WiPDA), Fayetteville, AR, 2016, pp. 47-52.

P. Wang, L. Zhang, X. Lu, H. Sun, W. Wang and D. Xu, "An Improved Active Crosstalk Suppression Method for High-Speed SiC MOSFETs," in IEEE Transactions on Industry Applications, vol. 55, No. 6, pp. 7736-7744, Nov.-Dec. 2019.

X. Wu, H. Zaman, P. Wu, R. Jia, X. Zhao and X. Wu, "A Quasi-Multilevel Gate Driver for Fast Switching and Crosstalk Suppression of SiC Devices," in IEEE Access, vol. 8, pp. 191403-191412, 2020.

F. Gao, Q. Zhou, P. Wang and C. Zhang, "A Gate Driver of SiC MOSFET for Suppressing the Negative Voltage Spikes in a Bridge Circuit," in IEEE Transactions on Power Electronics, vol. 33, No. 3, pp. 2339-2353, Mar. 2018.

Z. Zhang, J. Dix, F. F. Wang, B. J. Blalock, D. Costinett and L. M. Tolbert, "Intelligent Gate Drive for Fast Switching and Crosstalk Suppression of SiC Devices," in IEEE Transactions on Power Electronics, vol. 32, No. 12, pp. 9319-9332, Dec. 2017.

Z. Zhang, Z. Wang, F. Wang, L. M. Tolbert and B. J. Blalock, "Reliability-oriented design of gate driver for SiC devices In voltage source converter," 2015 IEEE International Workshop on Integrated Power Packaging (IWIPP), Chicago, IL, 2015, pp. 20-23.

J. Dix, Z. Zhang and B. J. Blalock, "CMOS gate drive IC with embedded cross talk suppression circuitry for SiC devices," 2016 IEEE Applied Power Electronics Conference and Exposition (APEC), Long Beach, CA, 2016, pp. 684-691.

S. Li, Y. Zhang and X.-y. Li, "Driving Auxiliary Circuit Based on SiC MOSFET Series Disturbance Suppression," 2020 12th IEEE Pes Asia-Pacific Power and Energy Engineering Conference (APPEEC), Nanjing, China, 2020, pp. 1-5.

S. Yin, K. J. Tseng, C. F. Tong and R. Simanjorang, "Design of high-speed gate driver to reduce switching loss and mitigate parasitic effects for SiC MOSFET," in IET Power Electronics, vol. 10, No. 10, pp. 1183-1189, Aug. 18, 2017.

S. Yin, K. J. Tseng, C. F. Tong, R. Simanjorang, C. J. Gajanayake and A. K. Gupta, "A novel gate assisted circuit to reduce switching loss and eliminate shoot-through in SiC half bridge configuration," 2016 IEEE Applied Power Electronics Conference and Exposition (APEC), Long Beach, CA, 2016, pp. 3058-3064.

H. Li et al., "Assist Gate Driver Circuit on Crosstalk Suppression for SiC MOSFET Bridge Configuration," in IEEE Journal of Emerging and Selected Topics in Power Electronics, vol. 8, No. 2, pp. 1611-1621, Jun. 2020.

S. Zhao et al., "Adaptive Multi-Level Active Gate Drivers for SiC Power Devices," in IEEE Transactions on Power Electronics, vol. 35, No. 2, pp. 1882-1898, Feb. 2020.

Y. Yang, Y. Wen and Y. Gao, "A Novel Active Gate Driver for Improving Switching Performance of High-Power SiC MOSFET Modules," in IEEE Transactions on Power Electronics, vol. 34, No. 8, pp. 7775-7787, Aug. 2019.

Y. Yang, Y. Wang and Y. Wen, "An active gate driver for improving switching performance of SiC MOSFET," 2018 7th International Symposium on Next Generation Electronics (ISNE), Taipei, 2018, pp. 1-4.

Z. Qiu et al., "An Intelligent Three-level Active Gate Driver for Crosstalk Suppression of SiC MOSFET," 2020 IEEE Energy Conversion Congress and Exposition (ECCE), Detroit, MI, USA, 2020, pp. 203-208.

Y. Chen, R. Wang, X. Liu and Y. Kang, "Gate-Drive Power Supply With Decayed Negative Voltage to Solve Crosstalk Problem of GaN Synchronous Buck Converter," in IEEE Transactions on Power Electronics, vol. 36, No. 1, pp. 6-11, Jan. 2021.

G. Li et al., "A Level Shift Gate Driving Circuit of SiC MOSFET with Crosstalk Suppression Capability," 2020 IEEE Applied Power Electronics Conference and Exposition (APEC), New Orleans, LA, USA, 2020, pp. 1806-1812.

F. Mo, J. Furuta and K. Kobayashi, "A low surge voltage and fast speed gate driver for SiC MOSFET with switched capacitor circuit," 2016 IEEE 4th Workshop on Wide Bandgap Power Devices and Applications (WiPDA), Fayetteville, AR, 2016, pp. 282-285.

(56) References Cited

OTHER PUBLICATIONS

H. Gui, J. Sun and L. M. Tolbert, "Charge Pump Gate Drive to Reduce Turn-ON Switching Loss of SiC MOSFETs," in IEEE Transactions on Power Electronics, vol. 35, No. 12, pp. 13136-13147, Dec. 2020.

Q. He, Y. Zhu, H. Zhang, A. Huang, Q. Cai and H. Kim, "A Multilevel Gate Driver of SiC mosfets for Mitigating Coupling Noise in Bridge-Leg Converter," in IEEE Transactions on Electromagnetic Compatibility, vol. 61, No. 6, pp. 1988-1996, Dec. 2019.

C. Li et al., "High Off-State Impedance Gate Driver of SiC MOSFETs for Crosstalk Voltage Elimination Considering Common-Source Inductance," in IEEE Transactions on Power Electronics, vol. 35, No. 3, pp. 2999-3011, Mar. 2020.

C. Liu, Z. Zhang, Y. Liu, Y. Si and Q. Lei, "Smart Self-Driving Multilevel Gate Driver for Fast Switching and Crosstalk Suppression of SiC MOSFETs," in IEEE Journal of Emerging and Selected Topics in Power Electronics, vol. 8, No. 1, pp. 442-453, Mar. 2020.

B. Zhang, S. Xie, J. Xu, Q. Qian, Z. Zhang and K. Xu, "A Magnetic Coupling Based Gate Driver for Crosstalk Suppression of SiC MOSFETs," in IEEE Transactions on Industrial Electronics, vol. 64, No. 11, pp. 9052-9063, Nov. 2017.

Z. Dong, Z. Zhang, X. Ren, X. Ruan and Y. Liu, "A gate drive circuit with mid-level voltage for GaN transistors in a 7-MHz isolated resonant converter," 2015 IEEE Applied Power Electronics Conference and Exposition (APEC), Charlotte, NC, 2015, pp. 731-736.

A. Maerz, T. Bertelshofer, M. Bakran and M. Helsper, "A Novel Gate Drive Concept to Eliminate Parasitic Turn-on of SiC MOSFET in Low Inductance Power Modules," PCIM Europe 2017; International Exhibition and Conference for Power Electronics, Intelligent Motion, Renewable Energy and Energy Management, Nuremberg, Germany, 2017, pp. 1-7.

J.-Z. Fu, F. Fouquet, M. Kadi and P. Dherbécourt, "Experimental study of 600V GaN transistor under the short-circuit aging tests," 2018 19th IEEE Mediterranean Electrotechnical Conference (MELECON), 2018, pp. 249-253, doi: 10.1109/MELCON.2018.8379102.

S. Mbarek, F. Fouquet, P. Dherbecourt, M. Masmoudi, O. Latry, "Gate oxide degradation of SiC MOSFET under short-circuit aging tests," Microelectronics Reliability, vol. 64, 2016, pp. 415-418.

J.Z. Fu, F. Fouquet, M. Kadi, P. Dherbécourt, "Evolution of C—V and I—V characteristics for a commercial 600□V GaN GIT power device under repetitive shortcircuit tests," Microelectronics Reliability, vols. 88-90, 2018, pp. 652-655.

Shawki Douzi, Moncef Kadi, Habib Boulzazen, Mohamed Tlig, Jaleleddine Ben Hadj Slama, "Conducted EMI evolution of power SiC MOSFET in a Buck converter after short-circuit aging tests," Microelectronics Reliability, vols. 88-90, 2018, pp. 219-224.

"Silicon Carbide Power MOSFETC3MTM MOSFET Technology," Datasheet of C3M0065090J, Rev. C, Cree, Jan. 2018.

* cited by examiner

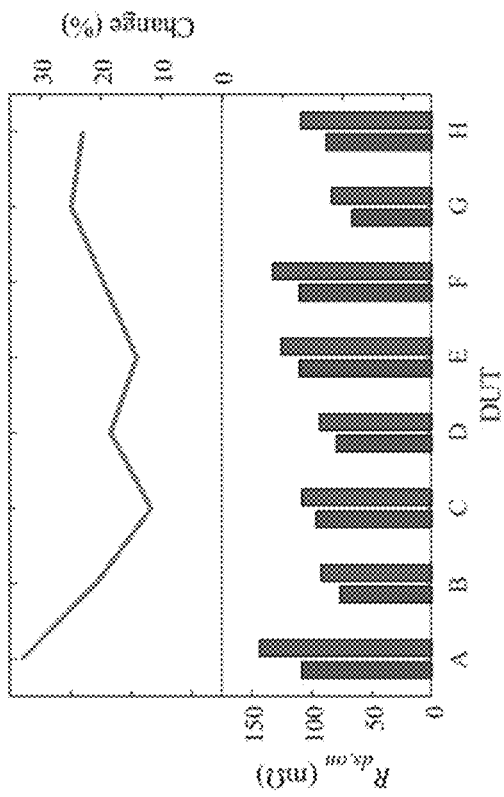
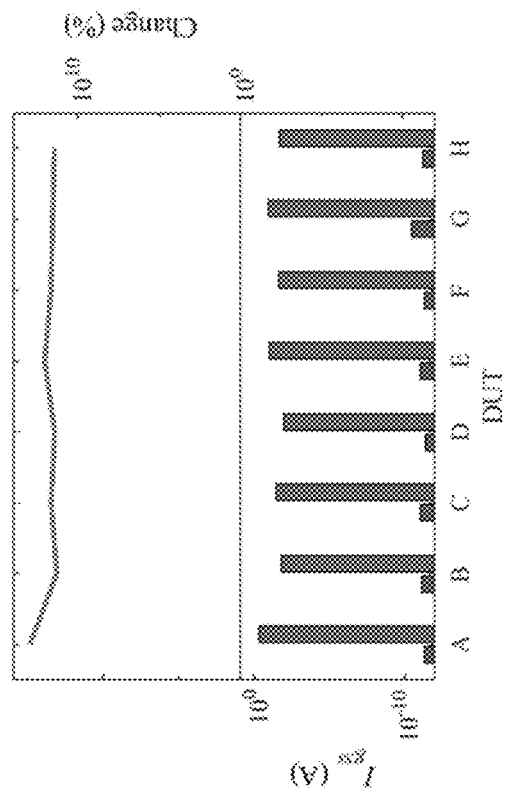
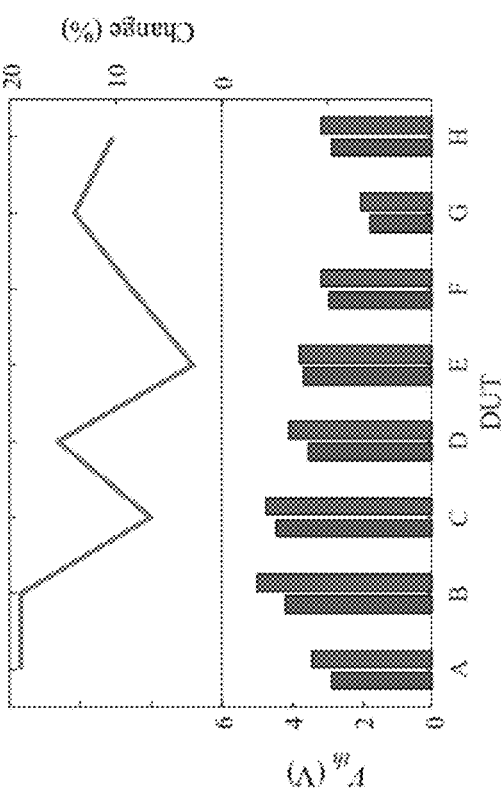
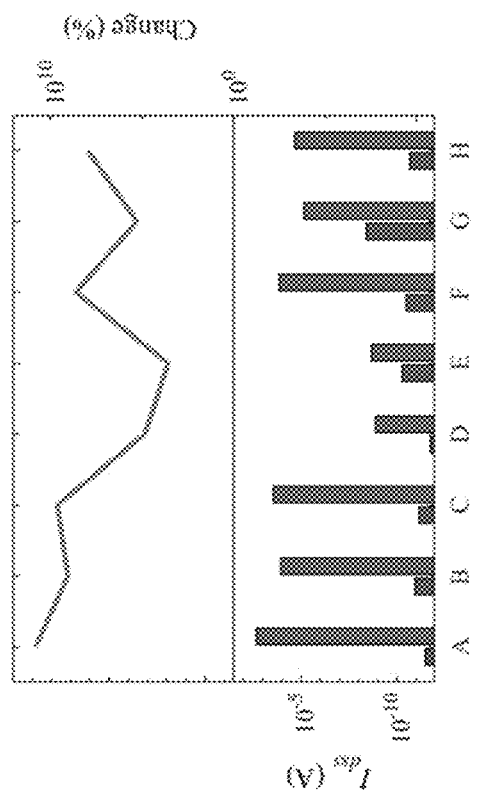
Figure 2A
Figure 2B
Figure 2C
Figure 2D

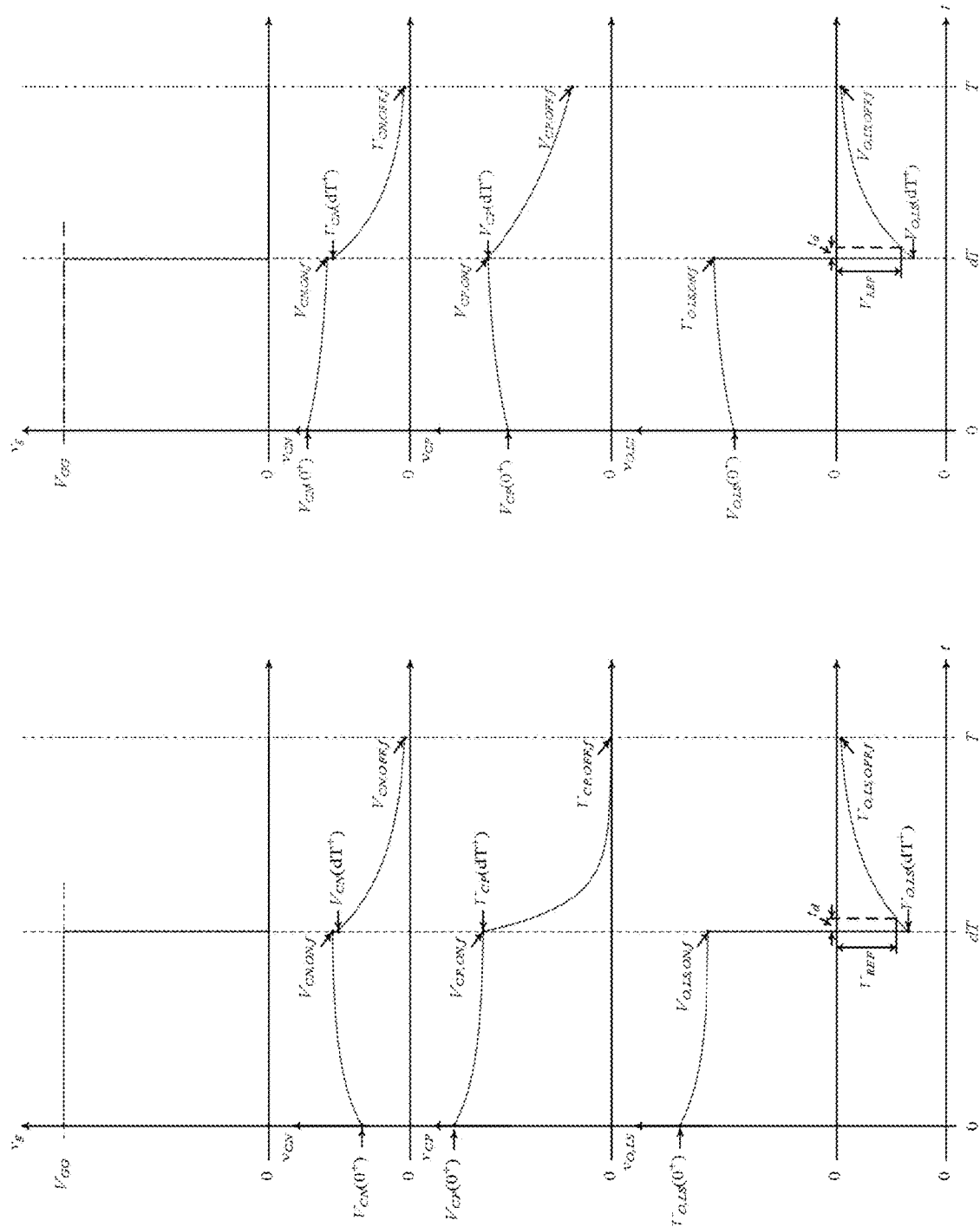

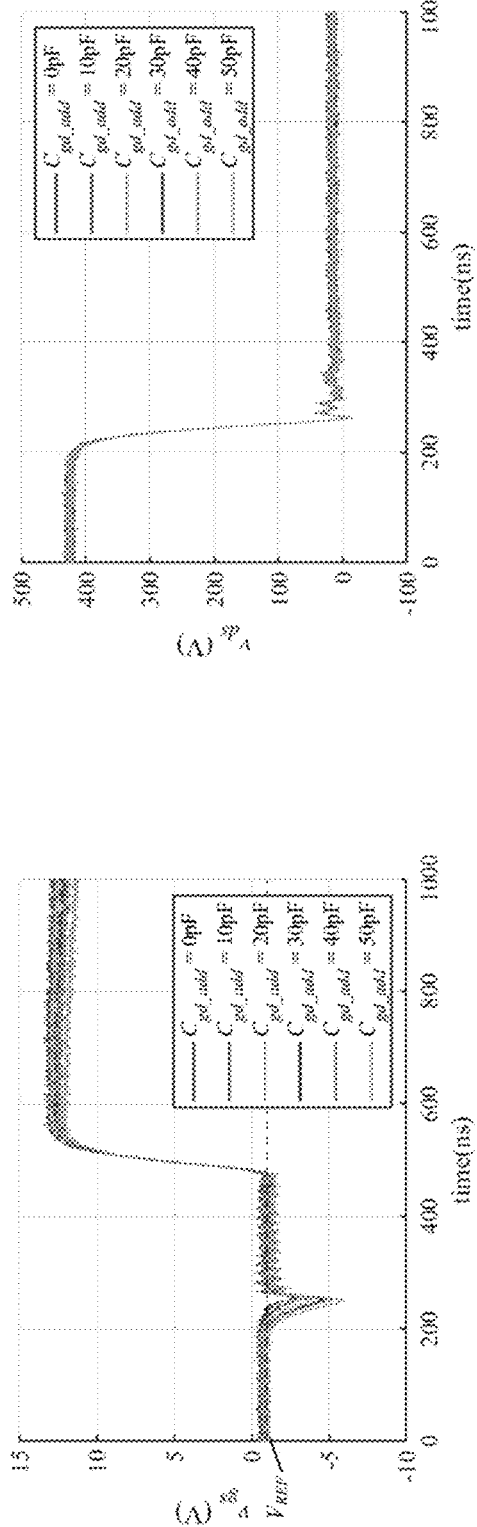
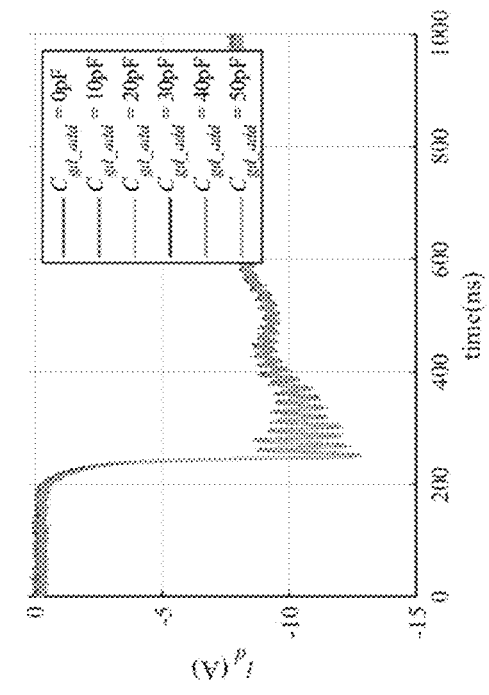
Figure 11A
Figure 11B
Figure 11C

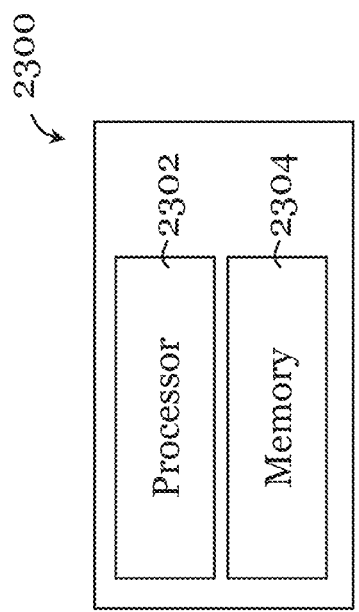

SIGNAL MODULATION CIRCUIT FOR SOLID STATE ELECTRONIC DEVICE AND CIRCUIT INCORPORATING THE SAME

TECHNICAL FIELD

The invention relates to a signal modulation circuit for a solid state electronic device such as a MOSFET. The invention also relates to a circuit that includes the signal modulation circuit.

BACKGROUND

Circuits with switching devices arranged in bridge-leg configuration can be found in existing power electronic systems, from low-power DC/DC converters with synchronous rectification to high-power multilevel systems. A basic version of the bridge-leg configuration can be constructed by connecting two switching devices in series. The two switching devices can be switched alternately with a dead time introduced to prevent shoot-through. Depending on the current direction at the mid-point of the bridge leg, each switching device operates either as a control switch or as a synchronous switch.

Due to the parasitic elements of the switching devices and circuit layout, crosstalk may occur when the control switch is turned on while the synchronous switch is turned off. The basic mechanism, using solid state electronic devices with gate, source, and drain as the switching devices, is as follows. First, upon turning on the control switch, the drain-source voltage of the synchronous switch rises abruptly. A displacement current is induced and injected into the gate of the synchronous switch through gate-source capacitance. Second, when the synchronous switch transits to the blocking state, its drain current reduces abruptly. A negative voltage is induced across the inductance associated with the source of the synchronous switch, such as source inductance of the switch and printed circuit board trace inductance. The above phenomena may lead to unwanted spurious voltage pulses on the gate-source voltage of the synchronous switch, which might cause false triggering and result in excessive switching losses, network oscillations, and/or intermittent shoot-through.

Existing techniques for addressing the crosstalk effect can be classified into two main approaches.

The first approach is based on limiting the magnitude of the spurious voltage pulses on the gate-source voltage. As the induced voltage can be approximated by $R_g C_{gd} dv/dt$, where $R_g$ is gate resistance, $C_{gd}$ is gate-drain capacitance, and $dv/dt$ is the rate of change of the gate-source voltage of the synchronous switch, its magnitude can be lowered, e.g., by using a small turn-off gate resistor, paralleling a capacitor or a diode across the gate resistor, or introducing a low impedance path between gate and source terminals with a BJT or MOSFET at turn off. The gate drive circuit is designed by considering the worst-case operating condition.

The second approach is based on superimposing a negative offset voltage onto the gate-source voltage to counteract the impact of the spurious voltage pulses. Existing methods for generating such negative offset voltage include using additional voltage source for the totem pole driver output, passive circuits, active circuits, or charge pump circuits. However, a high negative gate-source voltage may shorten the lifespan of the switching device. In case of a SiC MOSFET, its gate oxide layer is relatively thin. The electric field within the gate oxide and between the drain and the source will increase if the SiC MOSFET is subject to a high negative gate-source voltage. In addition, the forward voltage drop of the body diode increases with the increase in the magnitude of the gate-source voltage upon reverse conduction. Some existing multi-level gate driving technologies can counteract the effect of the spurious voltage pulses and keep the static negative gate-source voltage stress low to lower the forward voltage drop of the body diode. However, they usually require additional power supplies, fast switching devices, etc.

SUMMARY OF THE INVENTION

It is an object of some embodiments of the invention to address one or more of the above needs. It is an object of some embodiments of the invention to overcome or ameliorate one or more of the above disadvantages. It is an object of some embodiments of the invention to more generally to provide a signal modulation circuit for solid state electronic device. Some embodiments of the invention may include one or more objects not specifically described or illustrated.

In a first aspect, there is provided a circuit that comprises a first solid state electronic device and a second solid state electronic device arranged in a bridge-leg configuration, and a driver circuit operably connected with at least the first solid state electronic device for controlling operation of at least the first solid state electronic device. The first solid state electronic device and the second solid state electronic device are each selectively operable as a control switch and a synchronous switch and are each selectively operable in an ON state and an OFF state. The circuit further comprises a signal modulation circuit operably connected with or between the driver circuit and the first solid state electronic device. The signal modulation circuit comprises an input operably connected with the driver circuit, an output operably connected with the first solid state electronic device, and a variable resistance circuit operably connected between the input and the output and operably connected with the driver circuit. A resistance of the variable resistance circuit is adjustable by the driver circuit to prevent spurious operation of the first solid state electronic device. In other words, the driver circuit is operable to adjust the resistance of the variable resistance circuit to prevent spurious operation of the first solid state electronic device. The circuit may include additional circuit components, e.g., additional solid state electronic device(s). The driver circuit may be further operably connected with one or more further solid state electronic devices (e.g., the second solid state electronic device) for further controlling its or their operation. In some embodiments, the signal modulation circuit can be considered as part of the driver circuit.

In some embodiments, the signal modulation circuit is a first signal modulation circuit and the variable resistance circuit is a first variable resistance circuit, and the circuit further comprises a second signal modulation circuit operably connected with or between the driver circuit and the second solid state electronic device. The second signal modulation circuit comprises an input operably connected with the driver circuit, an output operably connected with the second solid state electronic device, and a second variable resistance circuit operably connected between the input and the output of the second signal modulation circuit and operably connected with the driver circuit. A resistance of the second variable resistance circuit is adjustable by the driver circuit to prevent spurious operation of the second solid state electronic device. In other words, the driver circuit is further operable to adjust the resistance of the second variable resistance circuit to prevent spurious operation of the second solid state electronic device. In some embodiments, the second signal modulation circuit can be considered as part of the driver circuit.

Optionally, the resistance of the variable resistance circuit is adjusted by the driver circuit to affect a signal at the output of the signal modulation circuit to prevent spurious activation (change to ON state) of the first solid state electronic device when, or only when, the first solid state electronic device is in the OFF state. Optionally, the resistance of the variable resistance circuit is adjusted by the driver circuit to affect a signal at the output of the signal modulation circuit to prevent spurious activation (change to ON state) of the first solid state electronic device when, or only when, the first solid state electronic device operates as a synchronous switch and is in the OFF state.

Optionally, the resistance of the variable resistance circuit is adjustable by the driver circuit to affect a signal (e.g., voltage signal) at the output of the signal modulation circuit to prevent spurious operation of the first solid state electronic device.

In some embodiments, the resistance of the variable resistance circuit is adjustable by the driver circuit in stepped manner. In some embodiments, the resistance of the variable resistance circuit is adjustable by the driver circuit in a stepless manner.

Optionally, the resistance of the second variable resistance circuit is adjusted by the driver circuit to affect a signal at the output of the second signal modulation circuit to prevent spurious activation (change to ON state) of the second solid state electronic device when, or only when, the second solid state electronic device is in the OFF state. Optionally, the resistance of the second variable resistance circuit is adjusted by the driver circuit to affect a signal at the output of the second signal modulation circuit to prevent spurious activation (change to ON state) of the second solid state electronic device when, or only when, the second solid state electronic device operates as a synchronous switch and is in the OFF state.

Optionally, the resistance of the variable resistance circuit is adjustable by the driver circuit to affect a signal (e.g., voltage signal) at the output of the second signal modulation circuit to prevent spurious operation of the second solid state electronic device.

In some embodiments, the resistance of the second variable resistance circuit is adjustable by the driver circuit in stepped manner. In some embodiments, the resistance of the second variable resistance circuit is adjustable by the driver circuit in a stepless manner.

Optionally, the first solid state electronic device comprises a field effect transistor with gate, drain, and source. Optionally, the field effect transistor comprises a MOSFET. In some embodiments, the MOSFET is a SiC MOSFET.

Optionally, the second solid state electronic device comprises a field effect transistor with gate, drain, and source. Optionally, the field effect transistor comprises a MOSFET. In some embodiments, the MOSFET is a SiC MOSFET. The type of the first solid state electronic device and the type of second solid state electronic device may be the same or different.

Optionally, the driver circuit comprises a gate driver circuit for the field effect transistor (the first solid state electronic device) and the signal modulation circuit is operably connected between the gate driver circuit and field effect transistor (the first solid state electronic device).

Optionally, the gate driver circuit is a first gate driver circuit, and the driver circuit further comprises a second gate driver circuit for the field effect transistor (the second solid state electronic device) and the signal modulation circuit is operably connected between the second gate driver circuit and field effect transistor (the second solid state electronic device).

Optionally, the output of the signal modulation circuit is connected, directly or indirectly, across the gate and source of the field effect transistor (the first solid state electronic device).

Optionally, the output of the second signal modulation circuit is connected, directly or indirectly, across the gate and source of the field effect transistor (the second solid state electronic device).

Optionally, the driver circuit further comprises a detector circuit operable to detect a gate-source voltage of the field effect transistor (the first solid state electronic device). Optionally, the driver circuit further comprises a control circuit operable to compare the detected gate-source voltage with a reference voltage and to provide a control signal for controlling the resistance of the variable resistance circuit based on the comparison. The reference voltage may be fixed or adjustable (e.g., adjusted by or via the control circuit).

The resistance of the variable resistance circuit may affect the gate-source voltage of the field effect transistor (the first solid state electronic device). The resistance of the second variable resistance circuit may affect the gate-source voltage of the field effect transistor (the second solid state electronic device).

Optionally, the control circuit is arranged to provide the control signal during operation of the circuit when, or only when, the first solid state electronic device operates is in the OFF state. In some embodiments, the control circuit may be further arranged to provide the control signal during operation of the circuit when the first solid state electronic device operates is in the ON state. Optionally, the control circuit is arranged to provide the control signal during operation of the circuit when, or only when, the first solid state electronic device operates as a synchronous switch and is in the OFF state. In some embodiments, the control circuit may be further arranged to provide the control signal during operation of the circuit when the first solid state electronic device operates as a synchronous switch and is in the ON state.

Optionally, the detector circuit comprises an amplifier operably connected with the gate and source of the field effect transistor (the first solid state electronic device).

Optionally, the control circuit comprises: a comparator operably connected with the amplifier for comparing the detected gate-source voltage with the reference voltage and a controller operably connected with the comparator to provide the control signal.

Optionally, the control circuit further comprises a latch circuit operably connected with or between the comparator and the controller. The latch circuit is arranged to be in a first state when it is determined that the detected gate-source voltage is larger than the reference voltage and in a second state when it is determined that the detected gate-source voltage is smaller than the reference voltage. Optionally, the controller is arranged to detect a state of the latch circuit and to provide the control signal based on the detected state of the latch circuit. In some embodiments, the first state may be high and the second state may be low. In some embodiments, the first state may be low and the second state may be high.

Optionally, the controller is arranged to detect the state of the latch circuit and to provide the control signal when, or only when, the first solid state electronic device is in the OFF state. Optionally, the controller is arranged to detect the state of the latch circuit and to provide the control signal when, or only when, the first solid state electronic device operates as a synchronous switch and is in the OFF state.

Optionally, the controller is arranged to repeatedly (e.g., periodically) detect the state of the latch circuit and to provide consecutive control signals for dynamically or adaptively adjusting the resistance of the variable resistance circuit.

Optionally, the controller is arranged to repeatedly (e.g., periodically) detect the state of the latch circuit and to provide consecutive control signals for dynamically or adaptively adjusting the resistance of the variable resistance circuit when, or only when, the first solid state electronic device is in the OFF state. Optionally, the controller is arranged to repeatedly (e.g., periodically) detect the state of the latch circuit and to provide consecutive control signals for dynamically or adaptively adjusting the resistance of the variable resistance circuit when, or only when, the first solid state electronic device operates as a synchronous switch and is in the OFF state.

Optionally, the controller is arranged to provide a first control signal for reducing the resistance of the variable resistance circuit when the latch circuit is detected to be in the first state and provide a second control signal (different from the first) for increasing the resistance of the variable resistance circuit when the latch circuit is detected to be in the second state.

Optionally, the first control signal is arranged to reduce the resistance of the variable resistance circuit by a predetermined amount. The predetermined amount may be fixed or adjustable.

Optionally, the second control signal is arranged to increase the resistance of the variable resistance circuit by a predetermined amount. The predetermined amount may be fixed or adjustable.

Optionally, the driver circuit further comprises another detector circuit and another control circuit for the field effect transistor (the second solid state electronic device), similar to or the same as (preferably with one or more of the above features of) the detector circuit and the control circuit for the field effect transistor (the first solid state electronic device).

Optionally, the variable resistance circuit comprises a rheostat controllable by the driver circuit to adjust the resistance.

Optionally, the rheostat comprises a digital rheostat.

Optionally, the signal modulation circuit comprises: a first resistor-capacitor circuit, a second resistor-capacitor circuit, and a diode circuit. The variable resistance circuit is part of the second resistor-capacitor circuit. Optionally, the diode circuit is operably connected between the first resistor-capacitor circuit and the second resistor-capacitor circuit.

The first resistor-capacitor circuit may include one or more resistors and one or more capacitors electrically connected in parallel with the one or more resistors. In one example, the first resistor-capacitor circuit consists of a single resistor electrically connected in parallel with a single capacitor.

The diode circuit may include one or more diodes. In one example, the diode circuit consists of a single diode.

The second resistor-capacitor circuit may include one or more resistors, one or more capacitors electrically connected in parallel with the one or more resistors, and the rheostat electrically connected in parallel with the one or more capacitors. In one example, the second resistor-capacitor circuit consists of a first resistor, a second resistor, the rheostat, and a single capacitor, in which the first resistor and the rheostat are electrically connected in series, the second resistor and the single capacitor are electrically connected in parallel, and a combination of the first resistor and the rheostat are electrically connected in parallel with each of the second resistor and the single capacitor.

Optionally, the second variable resistance circuit may have the same or similar construction as the variable resistance circuit.

Optionally, the circuit further comprises a processor for determining a health condition, in particular gate-oxide health condition, of the first solid state electronic device based on the resistance of the variable resistance circuit. Optionally, the processor may further determine a health condition, in particular gate-oxide health condition, of the second solid state electronic device based on the resistance of the second variable resistance circuit.

Optionally, the circuit further comprises a monitoring device or circuit for monitoring resistance of the variable resistance circuit over time, and the processor is arranged to determine the health condition, in particular gate-oxide health condition, of the first solid state electronic device based on the monitored resistance of the variable resistance circuit over time. In one example, the processor may compare the monitored resistance value(s) with predetermined value(s), threshold(s), pattern(s), e.g., stored in look-up table, to determine the health condition, in particular gate-oxide health condition, of the first solid state electronic device. Optionally, the monitoring device or circuit may further monitor resistance of the second variable resistance circuit over time, and the processor is further arranged to determine the health condition, in particular gate-oxide health condition, of the second solid state electronic device based on the monitored resistance of the second variable resistance circuit over time. In one example, the processor may compare the monitored resistance value(s) with predetermined value(s), threshold(s), pattern(s), e.g., stored in look-up table, to determine the health condition, in particular gate-oxide health condition, of the second solid state electronic device.

Optionally, the circuit comprises or is a converter circuit or an inverter circuit that includes the first solid state electronic device and the second solid state electronic device. For example, the converter circuit may be a synchronous buck converter circuit, a half bridge converter circuit, a full bridge converter circuit, etc. For example, the inverter circuit may be a half bridge inverter circuit or a full bridge inverter circuit.

In a second aspect, there is provided the signal modulation circuit in the circuit of the first aspect. The signal modulation circuit may be provided separately from the other parts of the circuit.

In a third aspect, there is provided the signal modulation circuit and the driver circuit in the circuit of the first aspect. The signal modulation circuit and the driver circuit may be provided separately from the other parts of the circuit. The signal modulation circuit and the driver circuit may be arranged at least partly on an integrated circuit.

In a fourth aspect, there is provided a signal modulation circuit for a solid state electronic device of a circuit. The circuit comprises a first solid state electronic device and a second solid state electronic device arranged in a bridge-leg configuration, and a driver circuit operably connected with at least the first solid state electronic device for controlling operation of at least the first solid state electronic device. The first solid state electronic device and the second solid state electronic device are each selectively operable as a control switch and a synchronous switch and are each selectively operable in an ON state and an OFF state. The signal modulation circuit is operably connectable with or between the driver circuit and the first solid state electronic device. The signal modulation circuit includes an input operably connectable with the driver circuit, an output operably connectable with the first solid state electronic device, and a variable resistance circuit operably connected between the input and the output and operably connectable with the driver circuit. When the signal modulation circuit is operably connected with or between the driver circuit and the first solid state electronic device, a resistance of the variable resistance circuit is adjustable by the driver circuit to prevent spurious operation of the first solid state electronic device. In other words, when the signal modulation circuit is operably connected with or between the driver circuit and the first solid state electronic device, the driver circuit is operable to adjust the resistance of the variable resistance circuit to prevent spurious operation of the first solid state electronic device. The circuit may include additional circuit components, e.g., additional solid state electronic device(s). The driver circuit may be further operably connected with one or more further solid state electronic device (e.g., the second solid state electronic device) for controlling its or their operation.

Optionally, when the signal modulation circuit is operably connected with or between the driver circuit and the first solid state electronic device: the resistance of the variable resistance circuit is adjustable by the driver circuit to affect a signal at the output to prevent spurious activation (change to ON state) of the first solid state electronic device when, or only when, the first solid state electronic device is in the OFF state. Optionally, when the signal modulation circuit is operably connected with or between the driver circuit and the first solid state electronic device: the resistance of the variable resistance circuit is adjustable by the driver circuit to affect a signal at the output to prevent spurious activation (change to ON state) of the first solid state electronic device when, or only when, the first solid state electronic device operates as a synchronous switch and is in the OFF state.

Optionally, when the signal modulation circuit is operably connected with or between the driver circuit and the first solid state electronic device: the resistance of the variable resistance circuit is adjustable by the driver circuit to affect a signal (e.g., voltage signal) at the output to prevent spurious operation of the first solid state electronic device. In some embodiments, the resistance of the variable resistance circuit is adjustable in stepped manner.

In some embodiments, the resistance of the variable resistance circuit is adjustable in a stepless manner.

Optionally, the first solid state electronic device comprises a field effect transistor with gate, drain, and source. Optionally, the field effect transistor comprises a MOSFET. In some embodiments, the MOSFET is a SiC MOSFET.

Optionally, the driver circuit comprises a gate driver circuit for the field effect transistor (the first solid state electronic device) and the signal modulation circuit is operably connectable between the gate driver circuit and field effect transistor (the first solid state electronic device).

Optionally, the output of the signal modulation circuit is connectable, directly or indirectly, across the gate and source of the field effect transistor (the first solid state electronic device).

Optionally, the driver circuit further comprises a detector circuit operable to detect a gate-source voltage of the field effect transistor (the first solid state electronic device). Optionally, the driver circuit further comprises a control circuit operable to compare the detected gate-source voltage with a reference voltage and to provide a control signal for controlling the resistance of the variable resistance circuit based on the comparison. The reference voltage may be fixed or adjustable (e.g., adjusted by or via the control circuit)

The resistance of the variable resistance circuit may affect the gate-source voltage of the field effect transistor (the first solid state electronic device).

Optionally, when the signal modulation circuit is operably connected with or between the driver circuit and the first solid state electronic device, the signal modulation circuit is operable to receive from the driver circuit: consecutive control signals for dynamically or adaptively adjusting the resistance of the variable resistance circuit.

Optionally, when the signal modulation circuit is operably connected with or between the driver circuit and the first solid state electronic device, the signal modulation circuit is operable to receive from the driver circuit: a first control signal for reducing the resistance of the variable resistance circuit and provide a second control signal (different from the first) for increasing the resistance of the variable resistance circuit. Optionally, the first control signal is arranged to reduce the resistance of the variable resistance circuit by a predetermined amount. The predetermined amount may be fixed or adjustable. Optionally, the second control signal is arranged to increase the resistance of the variable resistance circuit by a predetermined amount. The predetermined amount may be fixed or adjustable.

Optionally, the variable resistance circuit comprises a rheostat controllable by the driver circuit to adjust the resistance. Optionally, the rheostat comprises a digital rheostat.

Optionally, the signal modulation circuit comprises: a first resistor-capacitor circuit, a second resistor-capacitor circuit, and a diode circuit. The variable resistance circuit is part of the second resistor-capacitor circuit. Optionally, the diode circuit is operably connected between the first resistor-capacitor circuit and the second resistor-capacitor circuit.

The first resistor-capacitor circuit may include one or more resistors and one or more capacitors electrically connected in parallel with the one or more resistors. In one example, the first resistor-capacitor circuit consists of a single resistor electrically connected in parallel with a single capacitor.

The diode circuit may include one or more diodes. In one example, the diode circuit consists of a single diode.

The second resistor-capacitor circuit may include one or more resistors, one or more capacitors electrically connected in parallel with the one or more resistors, and the rheostat electrically connected in parallel with the one or more capacitors. In one example, the second resistor-capacitor circuit consists of a first resistor, a second resistor, the rheostat, and a single capacitor, in which the first resistor and the rheostat are electrically connected in series, the second resistor and the single capacitor are electrically connected in parallel, and a combination of the first resistor and the rheostat are electrically connected in parallel with each of the second resistor and the single capacitor.

Optionally, the circuit comprises or is a converter circuit or an inverter circuit that includes the first solid state electronic device and the second solid state electronic device. For example, the converter circuit may be a synchronous buck converter circuit, a half bridge converter circuit, a full bridge converter circuit, etc. For example, the inverter circuit may be a half bridge inverter circuit or a full bridge inverter circuit.

Other features and aspects of the invention will become apparent by consideration of the detailed description and accompanying drawings. Any feature(s) described herein in relation to one aspect or embodiment may be combined with any other feature(s) described herein in relation to any other aspect or embodiment as appropriate and applicable.

Terms of degree such that "generally", "about", "substantially", or the like, are used, depending on context, to account for manufacture tolerance, degradation, trend, tendency, imperfect practical condition, etc. For example, when a value is modified by terms of degree such as "about", such expression may include the stated value and its ±20%, ±15%, ±10%, ±5%, ±2%, or ±1%.

Unless otherwise specified or context requires otherwise, the terms "connected", "coupled", "mounted", or the like, are intended to encompass both direct and indirect, mechanical and/or electrical, connection, coupling, mounting, etc.

BRIEF DESCRIPTION OF THE DRAWINGS

Embodiments of the invention will now be described, by way of example, with reference to the accompanying drawings in which:

FIGS. 2A to 2G are graphs showing variations of intrinsic parameters of the different SiC MOSFETs before and after the short-circuit-current stress tests: FIG. 2A shows variations of threshold voltage $V_{th}$; FIG. 2B shows variations of on-state resistance $R_{ds,on}$; FIG. 2C shows variations of drain-source leakage current $I_{dss}$; FIG. 2D shows variations of gate-source leakage current $I_{gss}$; FIG. 2E shows variations of gate-source capacitance $C_{gs}$; FIG. 2F shows variations of drain-source capacitance $C_{ds}$; and FIG. 2G shows variations of gate-drain capacitance $C_{gd}$;

FIG. 4A is a graph showing waveforms of voltages $v_g$, $v_{CN}$, $v_{CP}$, and $v_{o,LS}$ in the gate drive circuit in FIG. 3 when the switching device M1 operates in Mode 1 ("ON" state);

FIG. 4B is a graph showing waveforms of voltages $v_g$, $v_{CN}$, $v_{CP}$, and $v_{o,LS}$ in the gate drive circuit in FIG. 3 when the switching device M1 operates in Mode 2 ("OFF" state);

FIG. 11A is a graph showing turn-on waveform of the gate-source voltage $v_{gs,2}$ of the switching device M2 when capacitor $\Delta C_{gd}$ of different capacitances is selectively connected between the gate and drain of the switching device M2 when the gate drive circuit is activated;

FIG. 11B is a graph showing turn-on waveform of the drain-source voltage $v_{ds,2}$ of the switching device M2 when capacitor $\Delta C_{gd}$ of different capacitances is selectively connected between the gate and drain of the switching device M2 when the gate drive circuit is activated;

FIG. 11C is a graph showing turn-on waveform of the drain current $i_{d,2}$ of the switching device M2 when capacitor $\Delta C_{gd}$ of different capacitances is selectively connected between the gate and drain of the switching device M2 when the gate drive circuit is activated;

FIG. 23 is a functional block diagram of a data processing system in one embodiment of the invention.

DETAILED DESCRIPTION

Inventors of the invention have devised, through research, experiments, and trials, that magnitude of the spurious voltage pulses may depend on various intrinsic and extrinsic factors, such as parasitic elements, drain current, aging condition of switches, etc. Inventors of the invention have realized that a gate driver or a gate drive circuit, if suitably arranged, can adaptively change the off-state negative gate-source voltage to reduce or minimize the voltage stress of the gate oxide hence can extend the lifetime of the switching device.

The following disclosure includes various sections. One of the sections presents experimental results of drift of intrinsic parameters of eight different solid state electronic devices before and after going through short-circuit-current stress cycling for 4000 times. The experimental results show that the magnitude of the spurious voltage pulses diminishes after aging. Another one of the sections presents a gate driver in some embodiments of the invention, which can adjust the off-state gate-source voltage dynamically for counteracting the effect of the spurious voltage pulses. The change of the off-state gate-source voltage can be monitored to determine, indirectly, the aging or health condition of the solid state electronic device switch. Another one of the sections presents an inverter circuit with a gate driver in one embodiment of the invention.

Overview on Change of Intrinsic Parameters after Cycling of the Solid State Electronic Device To investigate the effect of aging of solid state electronic devices, short-circuit-current stress tests (with 4000 short-circuit-current stress cycles) are performed on eight different solid state electronic devices (in this example, SiC MOSFETs), to determine the drift of seven operation parameters associated with the MOSFETs. These parameters include threshold voltage $V_{th}$, on-state resistance $R_{ds,on}$, drain-source leakage current $I_{dss}$, gate-source leakage current $I_{gss}$, gate-source capacitance $C_{gs}$, drain-source capacitance $C_{ds}$, and gate-drain capacitance $C_{gd}$.

Table I contains a list of the eight different SiC MOSFETs used in the test. In the test, the cycling procedure is based on those described in:

Fu et. al, "Experimental study of 600V GaN transistor under the short-circuit aging tests"

Mbarek et. al, "Gate oxide degradation of SiC MOSFET under short-circuit aging tests,"

Fu et. al, "Evolution of C-V and I-V characteristics for a commercial 600 V GaN GIT power device under repetitive short-circuit tests"

Douzi et. al, "Conducted EMI evolution of power SiC MOSFET in a Buck converter after short-circuit aging tests"

Figure 1A:
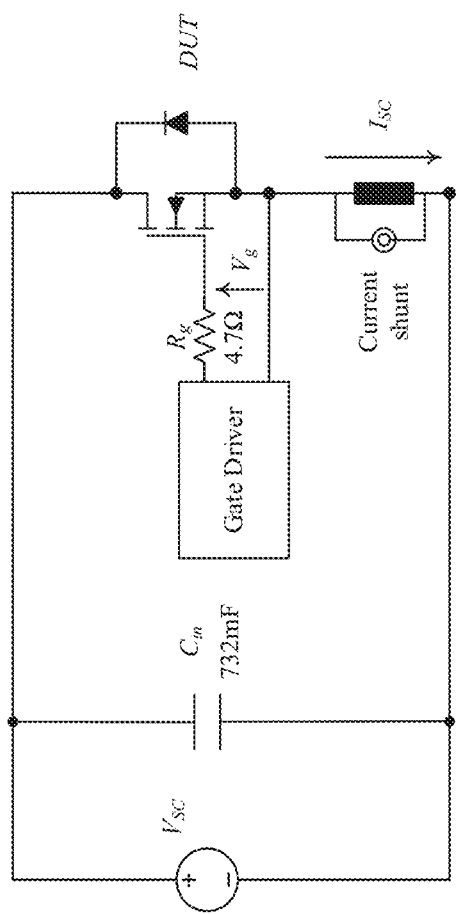
FIG. 1A is a circuit diagram illustrating a test setup for performing short-circuit-current stress tests on different SiC MOSFETs in one example.
Figure 1B:
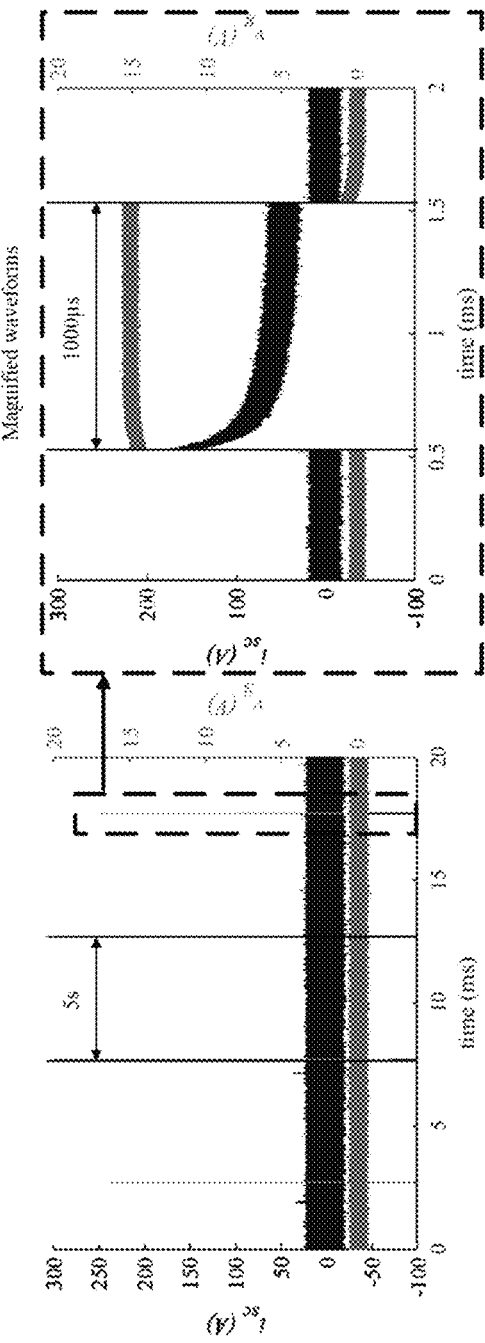
FIG. 1B is a graph showing waveforms of voltage $v_g$ and current $i_{SC}$ in the circuit of FIG. 1A as detected in the short-circuit-current stress test.

FIG. 1A shows the setup used for evaluating each of the eight SiC MOSFETs (each corresponding to a device under test (DUT)). In the test, in each cycle, the MOSFET is turned on for 1000 μs and then turned off for 4.999 seconds to reduce the effect of self-heating. In other words, each DUT takes 5.56 hours to complete a cycling test. The parameters before and after the cycling are recorded. FIG. 1B shows waveforms of voltage $v_g$ and current $i_{SC}$ in the setup of FIG. 1A as detected in the short-circuit-current stress test.

TABLE I

List of Power Devices under Test

| Device | Part no. | Manufacturer |
|---|---|---|
| A | NTHL080N120SC1A | Onsemi |
| B | IMW120R060M1HXKSA1 | Infineon Technologies |
| C | TW070J120B,S1Q | Toshiba |
| D | SCTW40N120G2V | STMicroelectronics |
| E | MSC080SMA120B | Microchip Technology |
| F | LSIC1MO120E0080 | Littelfuse |
| G | G3R75MT12D | GeneSiC Semiconductor |
| H | C2M0080120D | Wolfspeed |

In the test, the threshold voltage $V_{th}$ is measured by recording the gate-source voltage and drain current when the drain-source voltage $V_{ds}$=10V and drain current $I_d$=5 mA. FIG. 2A shows the changes of the threshold voltage $V_{th}$, ranging from 2.7% to 19%. In the graph of FIG. 2A, for each of the devices A-H, the bar on the left represents value before the test and the bar on the right represents value after the test (aging).

In the test, the on-state resistance $R_{ds,on}$ is measured indirectly by measuring the voltage and current of the SiC MOSFET when $V_{gs}$=15V and $I_d$=20 A. FIG. 2B shows the changes of the on-state resistance $R_{ds,on}$, ranging from 11.7% to 33.1%. In the graph of FIG. 2B, for each of the devices A-H, the bar on the left represents value before the test and the bar on the right represents value after the test (aging).

In the test, the drain-source leakage current $I_{dss}$ is measured under $V_{ds}$=100V. FIG. 2C shows the changes of the drain-source leakage current $I_{dss}$. The increment is found to be more than 36 times. In the graph of FIG. 2C, for each of the devices A-H, the bar on the left represents value before the test and the bar on the right represents value after the test (aging).

In the test, the gate-source leakage current $I_{gss}$, is measured when $V_{gs}$=15V. FIG. 2D shows the changes of the gate-source leakage current $I_{gss}$, with a significant percentage increment. In the graph of FIG. 2D, for each of the devices A-H, the bar on the left represents value before the test and the bar on the right represents value after the test (aging).

Figure 2F:
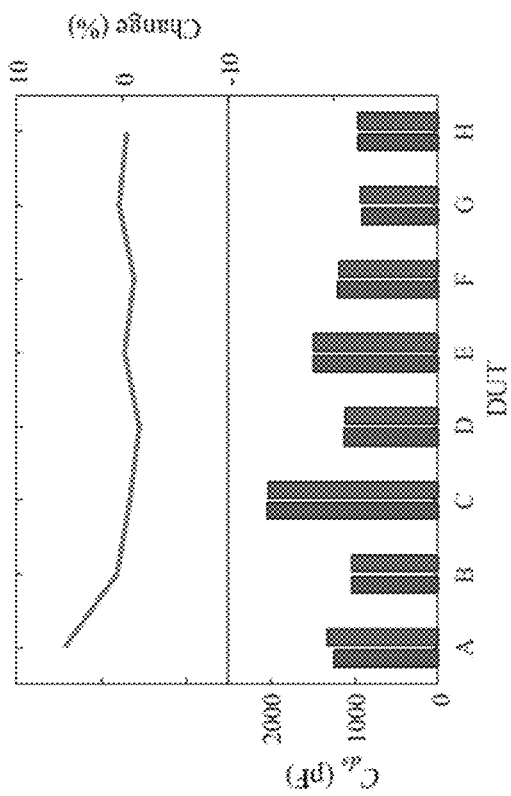
Figure 2E:
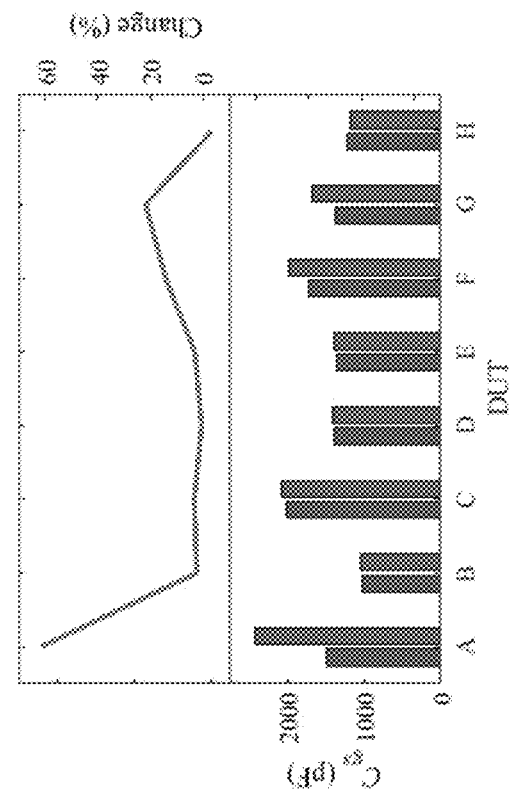

In the test, the gate-source capacitance $C_{gs}$ is measured by a power device analyzer (Keysight B1506A), when $V_{ds}$=0V. FIG. 2E shows the changes of the gate-source capacitance $C_{gs}$, ranging from −3.4% to 61%. In the graph of FIG. 2E, for each of the devices A-H, the bar on the left represents value before the test and the bar on the right represents value after the test (aging).

In the test, the drain-source capacitance $C_{ds}$ is also measured by the power device analyzer when $V_{ds}$=0V. FIG. 2F shows the changes of the drain-source capacitance $C_{ds}$, ranging from −1.6% to 5.5%. If the change of device A is excluded, the changes of the rest of devices dominantly vary between −1.6% and 0.5%. In the graph of FIG. 2F, for each of the devices A-H, the bar on the left represents value before the test and the bar on the right represents value after the test (aging).

Figure 2G:
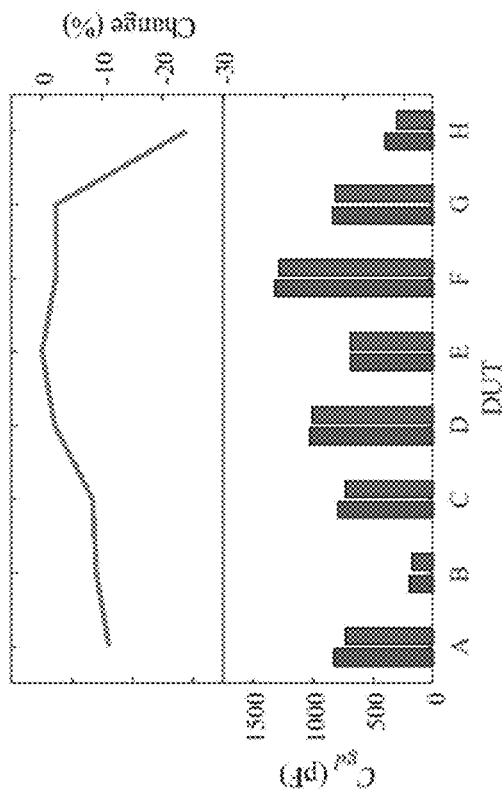

In the test, the gate-drain capacitance $C_{gd}$ is also measured by the power device analyzer when $V_{ds}$=0V. FIG. 2G shows the changes of the gate-drain capacitance $C_{gd}$, ranging from 0% to −24%. In the graph of FIG. 2G, for each of the devices A-H, the bar on the left represents value before the test and the bar on the right represents value after the test (aging).

Based on the obtained test results, it can be determined that all the investigated parameters have different levels of changes after the cycling. Thus, aging of the solid state electronic device can be monitored on the power handling side or the gate driving side. However, if aging of the solid state electronic device is monitored on the power handling side, sophisticated circuits (such as high-voltage and high-current sensing circuits) are required whereas if aging of the solid state electronic device is monitored on the gate driving side, sophisticated circuits may also be needed for extracting individual parameters.

Inventors of the invention have realized that the combined effects of the gate-related parameter changes on the magnitude of spurious voltage can be used to monitor aging of the solid state electronic device, in particular health condition of the gate-oxide of the solid state electronic device. The parameters include $I_{gss}$, $C_{gd}$, and $C_{gs}$. After the cycling, $I_{gss}$, increases whereas $C_{gd}$ and $C_{gs}$ decrease, thus the magnitude of the spurious voltage decreases. Such information can be used to adjust the negative off-state voltage and monitor device aging.

Circuit with Adaptive Level Shifter

Figure 3:
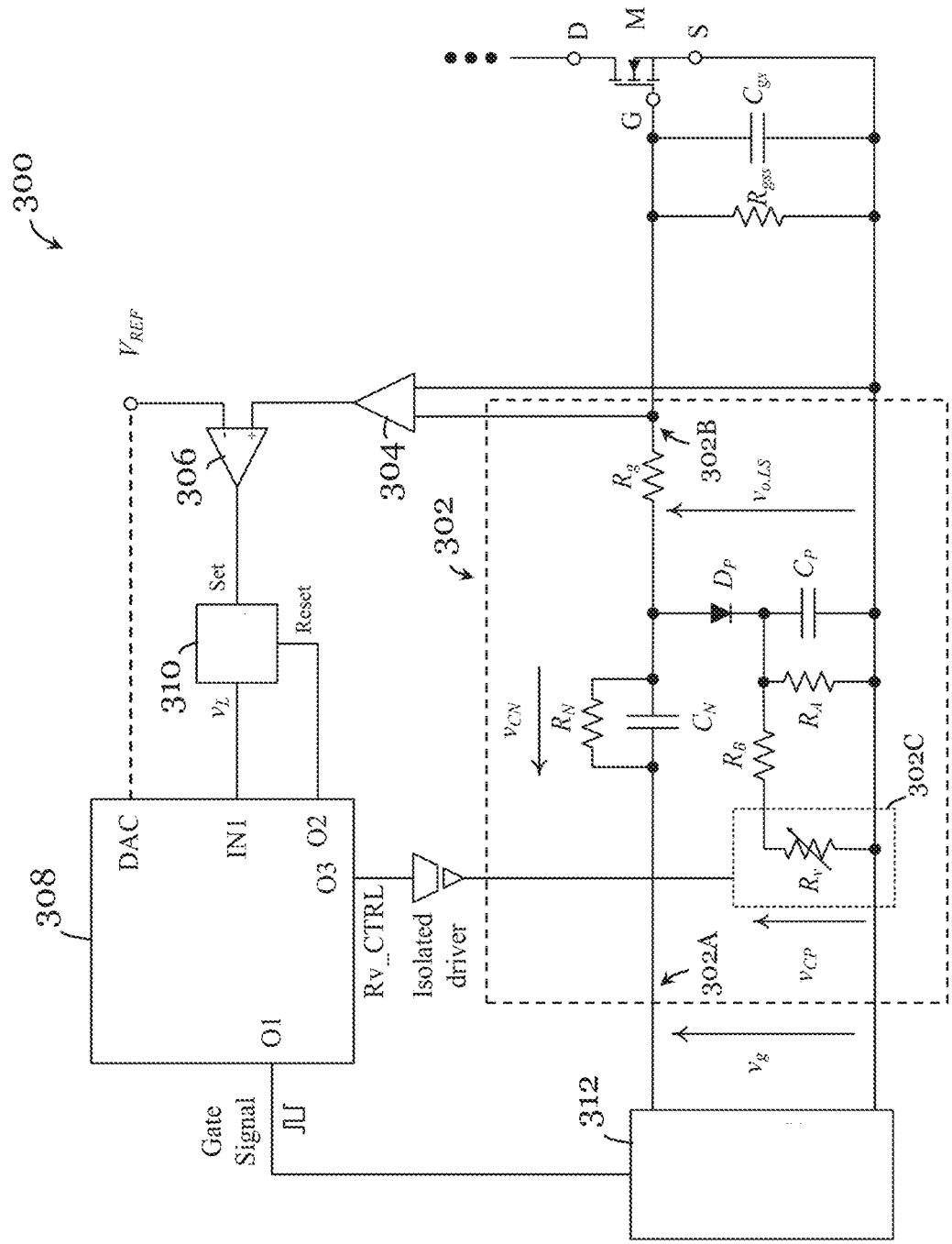
FIG. 3 is a circuit diagram illustrating a gate drive circuit having an adaptive level shifter with gate voltage detection in one embodiment of the invention.

FIG. 3 shows a circuit 300 in one embodiment of the invention. The circuit 300 includes a solid state electronic device M1, a driver circuit operably connected with the solid state electronic device M1 for controlling its operation, and a signal modulation circuit 302 operably connected with/between the driver circuit and the solid state electronic device M1. In this example, the solid state electronic device M1 is selectively operable as a control switch and a synchronous switch and is selectively operable in an ON state and an OFF state. The solid state electronic device M1 may be a MOSFET such as a SiC MOSFET. In this example, the driver circuit and the signal modulation circuit 302 can be considered together, as a gate drive circuit. While not illustrated, it should be noted that the circuit 300 can include at least one further solid state electronic devices operably connected with the solid state electronic device M1, at least one further signal modulation circuit for the at least one further solid state electronic devices, and the driver circuit can be further operably connected with the at least one further solid state electronic devices for controlling its/their operation.

Referring to FIG. 3, the signal modulation circuit 302 includes an input 302A operably connected with the driver circuit, an output 302B operably connected with the solid state electronic device M1, and a variable resistance circuit 302C operably connected between the input 302A and the output 302B and operably connected with the driver circuit. A resistance of the variable resistance circuit 302C is adjustable by the driver circuit to prevent spurious operation of the solid state electronic device M1. In this embodiment, the variable resistance circuit 302C is implemented using a rheostat, in particular a digital rheostat $R_v$.

The resistance of the variable resistance circuit 302C may be adjusted by the driver circuit to affect a signal at the output 302B to prevent spurious activation (change to ON state) of the solid state electronic device M1 when, or only when, the first solid state electronic device is in the OFF state (e.g., the first solid state electronic device operates as a synchronous switch and is in the OFF state). The resistance of the variable resistance circuit 302C is adjustable by the driver circuit to affect a signal (e.g., voltage signal) at the output 302B to prevent spurious operation of the solid state electronic device M1.

In this example, the driver circuit includes a gate driver circuit for the solid state electronic device M1 and the signal modulation circuit 302 is operably connected between the gate driver circuit and solid state electronic device M1. Specifically the output 302B of the signal modulation circuit 302 is connected across the gate and source of the solid state electronic device M1.

As shown in FIG. 3, the signal modulation circuit 302 includes two resistor-capacitor (RC) circuits and a diode circuit connected between the two RC circuits. One of the RC circuit includes a resistor $R_N$ and a capacitor $C_N$ connected in parallel. The diode circuit includes a diode $D_P$. Another one of the RC circuit includes a capacitor $C_P$, two fixed resistance resistors $R_A$,$R_B$, and the digital rheostat $R_v$. Resistor $R_B$ and the rheostat $R_v$ are connected in series. Resistor $R_A$ and the capacitor $C_P$ are connected in parallel. The resistor $R_B$ and the rheostat $R_v$, combined, are connected in parallel with each of the resistor $R_A$ and the capacitor $C_P$. The signal modulation circuit 302 can be considered as an adaptive level shifter.

As shown in FIG. 3, the driver circuit includes a detector circuit operable to detect a gate-source voltage of the solid state electronic device M1, and a control circuit operable to compare the detected gate-source voltage with a reference voltage $V_{REF}$ and to provide a control signal for controlling the resistance of the rheostat $R_v$ based on the comparison. The resistance of the rheostat $R_v$ can affect the gate-source voltage of the solid state electronic device M1. In this embodiment, the detector circuit comprises an amplifier 304 operably connected with the gate and source of the solid state electronic device M1. In this embodiment, the control circuit includes a comparator 306 operably connected with the amplifier 304 for comparing the detected gate-source voltage with the reference voltage $V_{REF}$ and a controller 308 operably connected with the comparator 306 to provide the control signal to the signal modulation circuit 302. In this embodiment, the control circuit further includes a latch circuit 310 operably connected between the comparator 306 and the controller 308. In this embodiment the controller 308 is a converter controller. In this embodiment the circuit also includes an isolated gate driver 312, in the form of an isolated gate driver IC, electrically connected between the controller 308 and the signal modulation circuit 302. The controller 308 is arranged to provide the gate signal to the isolated gate driver 312. The isolated gate driver 312 may be considered as part of the control circuit. The control circuit may operate when the solid state electronic device M1 is ON and/or when the solid state electronic device M1 is OFF.

The latch circuit 310 is arranged to be in a first state (e.g., HIGH) when it is determined that the detected gate-source voltage is larger than the reference voltage $V_{REF}$ and in a second state (e.g., LOW) when it is determined that the detected gate-source voltage is smaller than the reference voltage $V_{REF}$. The controller 308 can detect a state of the latch circuit 310 and accordingly provide the control signal based on the detected state of the latch circuit 310. In one example, the controller 308 is arranged to detect the state of the latch circuit 310 and to provide the control signal when, or only when, the solid state electronic device M1 is in the OFF state (e.g., the solid state electronic device M1 operates as a synchronous switch and is in the OFF state). The controller 308 can repeatedly (e.g., periodically) detect the state of the latch circuit 310 and provide consecutive control signals for dynamically or adaptively adjusting the resistance of the variable resistance circuit 302C. In this embodiment, the controller 308 is arranged to provide a control signal for reducing the resistance of the variable resistance circuit 302C when the latch circuit 310 is detected to be in the first state and provide a control signal for increasing the resistance of the variable resistance circuit 302C when the latch circuit 310 is detected to be in the second state.

Although not illustrated, in some embodiments, the circuit 300 may further include a processor for determining a health condition, in particular gate-oxide health condition, of the solid state electronic device M1 based on the resistance of the variable resistance circuit 302C. Although not illustrated, in some embodiments, the circuit 300 may further include a monitoring device or circuit for monitoring resistance of the variable resistance circuit 302C over time, and the processor can determine the health condition, in particular gate-oxide health condition, of the solid state electronic device M1 based on the monitored resistance of the variable resistance circuit over time. In some embodiments, the processor may further determine health condition, in particular gate-oxide health condition, of at least one further solid state electronic device based on the resistance of a variable resistance circuit associated with the at least one further solid state electronic device.

Referring back to FIG. 3, in this embodiment the total resistance across $C_P$ is $R_P$, which equals $$R_P = \frac{R_A(R_B + R_v)}{R_A + R_B + R_v} \quad (1)$$

When $R_v$ varies between zero (short-circuit condition) and infinity (open-circuit condition), $R_P$ varies between $R_{P,min}$ and $R_{P,max}$. Based on equation (1), $$R_{P,min} = \frac{R_A R_B}{R_A + R_B} \quad (2)$$

$$R_{P,max} = R_A \quad (3)$$

The driver output $v_g$ can be switched between 0 and $V_{GG}$. For the sake of simplicity in the analysis, the gate of the switching device M1 is modelled by an $R_{gss}$-$C_{gs}$ network shown in FIG. 3.

As mentioned, $R_{gss}$ is large initially and reduces upon aging. Thus, the impedance of the $R_{gss}$-$C_{gs}$ network is typically larger than the gate resistance $R_g$, which is not considered in the following analysis for simplicity.

Let d and T be the duty cycle and switching period of M1, respectively.

FIGS. 4A and 4B show waveforms of voltage $v_g$, the voltage $v_{CN}$ across $C_N$, the voltage $v_{CP}$ across $C_P$, and the output voltage of the level shifter $v_{0,LS}$ in the gate drive circuit in FIG. 3 when the switching device M1 operates in Mode 1 ("ON" state) and in Mode 2 ("OFF" state) respectively.

Figure 5B:
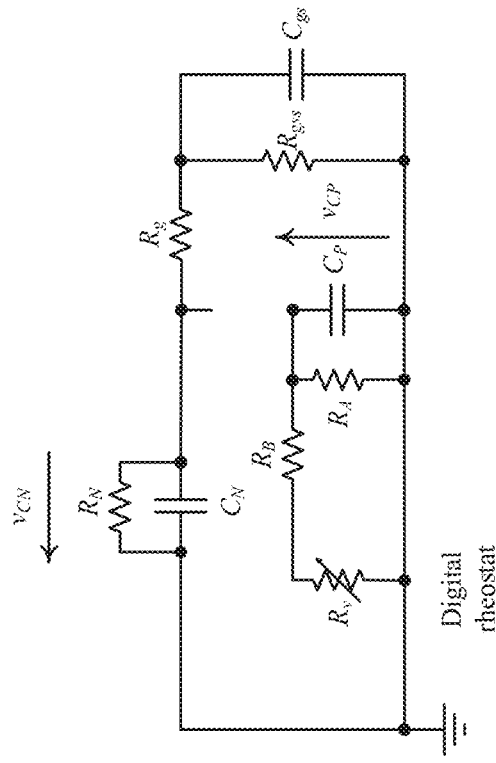
FIG. 5B is a circuit diagram illustrating the operation of the gate drive circuit in FIG. 3 when the switching device M1 operates in Mode 2 ("OFF" state)
Figure 5A:
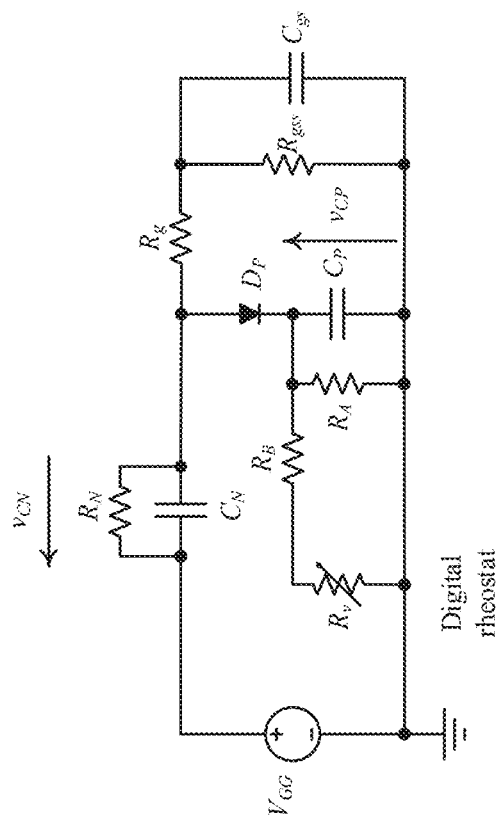
FIG. 5A is a circuit diagram illustrating the operation of the gate drive circuit in FIG. 3 when the switching device M1 operates in Mode 1 ("ON" state)

FIGS. 5A and 5B illustrate operation of the gate drive circuit in FIG. 3 when the switching device M1 operates in Mode 1 ("ON" state) and in Mode 2 ("OFF" state) respectively.

Mode 1 corresponds to on-state operation.

Specifically, when M1 is turned on, $v_g = V_{GG}$ and $D_P$ conducts. Let the forward drop of $D_P$ be zero. The equivalent circuit is shown in FIG. 5A. $v_{CN}$, $v_{CP}$, and $v_{0,LS}$ are expressed as $$v_{CN}(R_v, t) = \quad (4)$$

$$v_{CN,ON}(R_v,t) = \frac{(C_N + C_{P,ON})R_N + (C_{P,ON}R_{P,ON} - C_N R_N)e^{-\frac{t}{\tau_{ON}}}}{(C_N + C_{P,ON})(R_N + R_{P,ON})} V_{GG} -$$

$$\frac{C_{P,ON} e^{-\frac{t}{\tau_{ON}}}}{C_N + C_{P,ON}} V_{CP}(0^+) + \frac{C_N e^{-\frac{t}{\tau_{ON}}}}{C_N + C_{P,ON}} V_{CN}(0^+)$$

$$v_{CP}(R_v, t) = v_{CP,ON}(R_v, t) = \quad (5)$$

$$\frac{(C_N + C_{P,ON})R_{P,ON} + (C_N R_N - C_{P,ON}R_{P,ON})e^{-\frac{t}{\tau_{ON}}}}{(C_N + C_{P,ON})(R_N + R_{P,ON})} V_{GG} +$$

$$\frac{C_{P,ON} e^{-\frac{t}{\tau_{ON}}}}{C_N + C_{P,ON}} V_{CP}(0^+) - \frac{C_N e^{-\frac{t}{\tau_{ON}}}}{C_N + C_{P,ON}} V_{CN}(0^+)$$

$$v_{0,LS}(R_v, t) = v_{0,LS,ON}(R_v, t) = v_{CP,ON}(R_v, t) \quad (6)$$

where $t \in [0\ dT]$, $V_{CN}(0^+)$ and $V_{CP}(0^+)$ are the initial voltages of $C_N$ and $C_P$, respectively, $$\tau_{ON} = C_{eq,ON} R_{eq,ON},\ C_{eq,ON} = C_N + C_{P,ON},\ R_{eq,ON} = \frac{R_N R_{P,ON}}{R_N + R_{P,ON}},$$

$$C_{P,ON} = C_P + C_{gs},\ \text{and}\ R_{P,ON} = \frac{R_P R_{gss}}{R_P + R_{gss}}.$$

At the end of Mode 1, $v_{CN} = v_{CN,ON,f}$, $v_{CP} = v_{CP,ON,f}$, and $v_{0,LS} = v_{0,LS,ON,f}$. They can be expressed as $$V_{CN,ON,f} = v_{CN,ON}(R_v, dT) \quad (7)$$

$$V_{0,LS,ON,f} = V_{CP,ON,f} = v_{CP,ON}(R_v, dT) \quad (8)$$

Mode 2 corresponds to off-state operation.

Specifically, when M1 is turned off, $v_g=0$ and $D_P$ blocks. The equivalent circuit is shown in FIG. 5B. $v_{CN}$, $v_{CP}$, and $v_{o,LS}$ are expressed as $$v_{CN}(t) = v_{CN,OFF}(t) = e^{-\frac{t-dT}{\tau_{OFF}}} V_{CN}(dT^+) \quad (9)$$

$$v_{CP}(t) = v_{CP,OFF}(t) = e^{-\frac{t-dT}{\tau_{CP}}} V_{CP}(dT^+) \quad (10)$$

$$v_{o,LS}(t) = v_{o,LS,OFF}(t) = -v_{CN,OFF}(t) \quad (11)$$

where $t \in [0\ dT]$, $V_{CN}(dT^+)$ and $V_{CP}(dT^+)$ are the initial voltages of $C_N$ and $C_P$, respectively, $$\tau_{OFF} = C_{eq,OFF} R_{eq,OFF},\ C_{eq,OFF} = C_N + C_{gs},$$

$$R_{eq,OFF} = \frac{R_N R_{gss}}{R_N + R_{gss}},\text{ and } \tau_{CP} = C_P R_P.$$

At the end of Mode 2, $v_{CN}=V_{CN,OFF,f}$, $v_{CP}=V_{CP,OFF,f}$ and $v_{o,LS}=v_{o,LS,OFF,f}$. They can be expressed as $$V_{o,LS,OFF,f} = -V_{CN,OFF,f} = -v_{CN,OFF}(R_v,(1-d)T) \quad (12)$$

$$V_{CP,OFF,f} = v_{CP,OFF}(R_v,(1-d)T) \quad (13)$$

FIGS. 4A and 4B show the initial and final conditions of the capacitor voltages. The initial conditions of one mode are obtained from the final conditions of its previous mode.

For Mode 1, by applying the law of conservation of charge, $V_{CN}(0^+)$ and $V_{CP}(0^+)$ can be expressed as $$V_{CN}(0^+) = \frac{(C_P + C_{gs})V_{GG} + (C_N + C_{gs})V_{CN,OFF,f} - C_P V_{CP,OFF,f}}{C_N + C_P + C_{gs}} \quad (14)$$

$$V_{o,LS}(0^+) = V_{CP}(0^+) = \quad (15)$$

$$V_{GG} - V_{CN}(0^+) = \frac{C_N V_{GG} - (C_N + C_{gs})V_{CN,OFF,f} + C_P V_{CP,OFF,f}}{C_N + C_P + C_{gs}}$$

where $V_{o,LS}(0^+)$ is the initial output voltage of the level shifter in Mode 1.

For Mode 2, $V_{CN}(dT^+)$ and $V_{CP}(dT^+)$ can be expressed as $$V_{o,LS}(dT^+) = V_{CN}(dT^+) = \frac{C_N V_{CN,ON,f} - C_{gs} V_{CP,ON,f}}{C_N + C_{gs}} \quad (16)$$

$$V_{CP}(dT^+) = V_{CP,ON,f} \quad (17)$$

where $V_{o,LS}(dT^+)$ is the initial output voltage of the level shifter in Mode 2.

If $V_{CN}(0^+)<V_{CN,ON,f}$, the voltage of $C_N$ will increase when the gate signal is $V_{GG}$, as shown in FIG. 4A. If $V_{CN}(0^+)>V_{CN,ON,f}$, the voltage of $C_N$ will decrease when the gate signal is $V_{GG}$, as shown in FIG. 4B.

In this embodiment, the off-State Voltage of the device M1 can be regulated.

Specifically, the shifting level of $v_{o,LS}$ is varied by changing the value of $R_v$, so that the spurious voltage is less than a threshold voltage of M1. A spurious voltage typically occurs when the complementary power device is turned on. That is, it appears after M1 has entered Mode 2 with a deadtime of $t_d$. Based on equation (9):

$$-e^{-\frac{t_d}{\tau_{OFF}}} V_{CN}(dT^+) \leq V_{REF} \quad (18)$$

As illustrated in FIG. 3, when M1 has entered Mode 2, the gate-source voltage $v_{gs}$ is sensed and compared with a reference voltage $V_{REF}$. The output of the comparator is latched to give the signal $v_L$. The peak spurious voltage is regulated around $V_{REF}$ via a peak voltage control.

Figure 6:
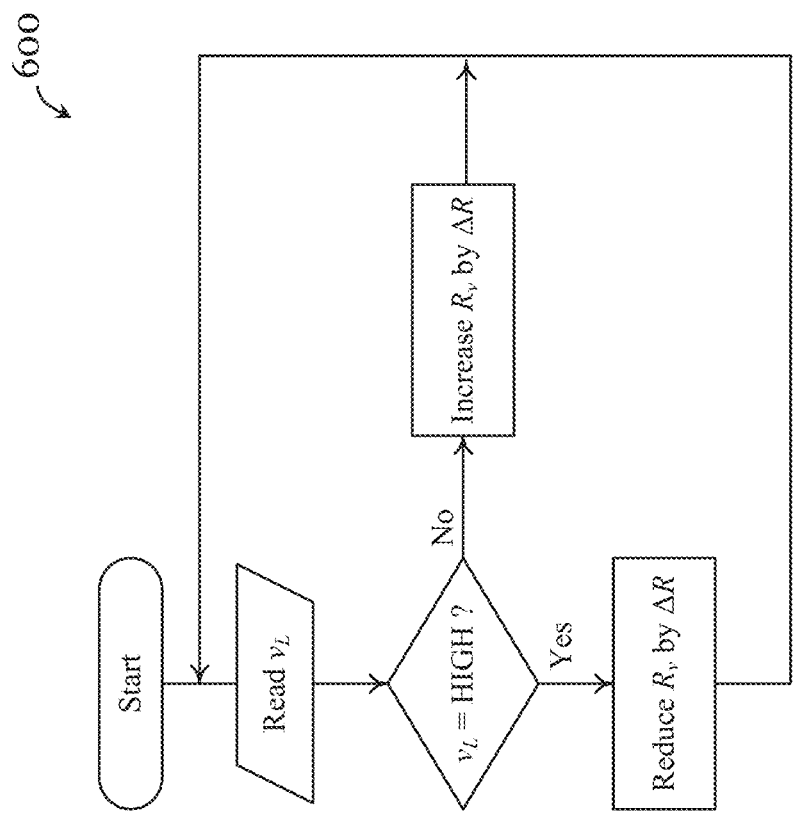
FIG. 6 is a flow chart illustrating a control method of the gate drive circuit in FIG. 3.

FIG. 6 illustrates the control method 600 of the gate drive circuit in FIG. 3. In this embodiment, after two deadtime intervals, i.e., $2t_d$, the controller 308 will check the input pin IN1 for $v_L$ once. If $v_L$ is HIGH, it implies that $v_{gs}>V_{REF}$. The controller 308 will decrease the value of $R_v$ by $\Delta R_v$, which is equal to unit change of $R_v$. For example, the 8-bit rheostat used in the experiment has a maximum value of 20 kΩ. Thus, $\Delta R_v=20$ kΩ/255=78.43Ω. If $v_L$ is LOW, it implies that $v_{gs}<V_{REF}$. The controller 308 will increase the value of $R_v$ by $\Delta R_v$.

The gate drive circuit in FIG. 3 further enables or facilities condition monitoring of switching device M1.

Generally, for healthy switch devices, the spurious voltage for certain loading condition is consistent, and the required $R_v$ to control the gate-source voltage is also consistent. When $I_{gss}$ increase, it decreases the gate source voltage. The adaptive level shifter will increase $R_v$ to compensate the effect from $I_{gss}$. Thus, by monitoring the value of $R_v$, the increase of $I_{gss}$ can be monitored, and the health of the switching device can be monitored.

Table II lists the components and their part number or value used in one example.

TABLE II

List of Components

| Parameter | Part no./Value | Parameter | Part no./Value |
|---|---|---|---|
| $C_N$ | 47 nF | $R_N$ | 100 Ω |
| $C_P$ | 4.7 nF | $R_A$ | 47 kΩ |
| $C_{gs}$ | 660 pF | $R_B$ | 10 Ω |
| $V_{GG}$ | 15 V | $R_{v,max}$ | 10 kΩ |
| $t_d$ | 400 ns | $R_g$ | 12 Ω |
| $D_P$ | 1N4148 | | |

Figure 7A:
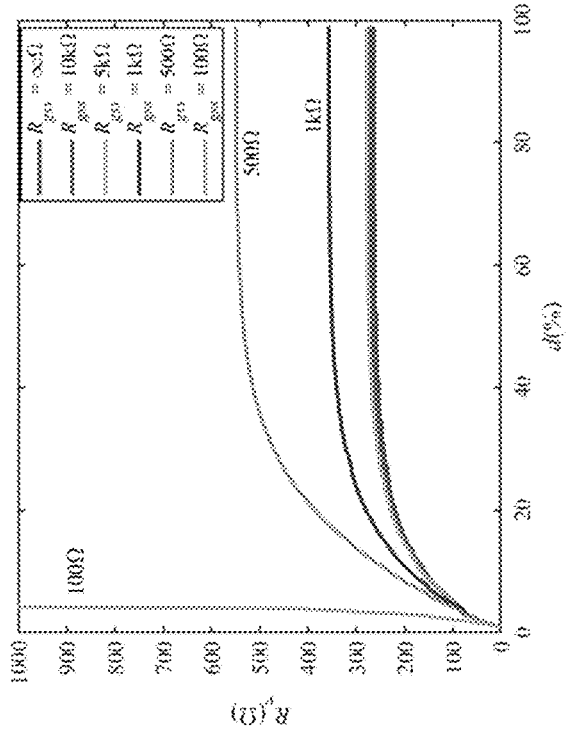
FIG. 7A is a graph showing relationships between the duty cycle d of the switching device M1 and the resistance $R_v$ with different values of $V_{REF}$ in the gate drive circuit of FIG. 3.

FIG. 7A shows the relationships between the duty cycle d and $R_v$ with different values of $V_{REF}$. The value of $R_{gss}$ is assumed to be infinite under the healthy condition. The information in Table II applies. The value of $R_v$ can adjust the off-state voltage so that the condition of equation (18) can be satisfied. For the same duty cycle and loading condition, $R_v$ increases as the magnitude of the spurious voltage decreases. For example, an aged switching device has a smaller value of $C_{gd}$ than that in the healthy condition, giving a lower spurious voltage.

Figure 7B:
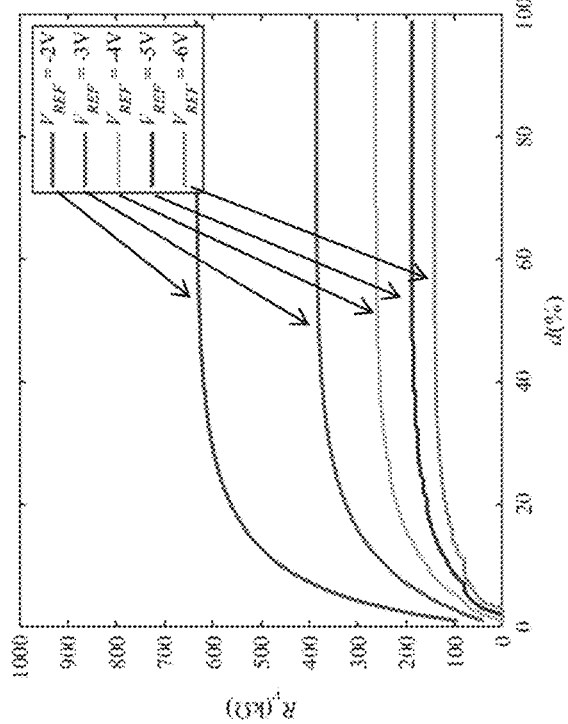
FIG. 7B is a graph showing relationships between the duty cycle d of the switching device M1 and the resistance $R_v$ with different values of $R_{gss}$ in the gate drive circuit of FIG. 3.

FIG. 7B shows the relationships between d and $R_v$ with $R_{gss}$ equal to infinity, 10 kΩ, 5 kΩ, 1 kΩ, and 100Ω to represent different levels of degradation. The value of $V_{REF}$ is set at −4V. Since $R_{gss}$ is in parallel with $C_P$, under the same duty cycle, the required values of $R_v$ will increase as $R_{gss}$ decreases.

Figure 7C:
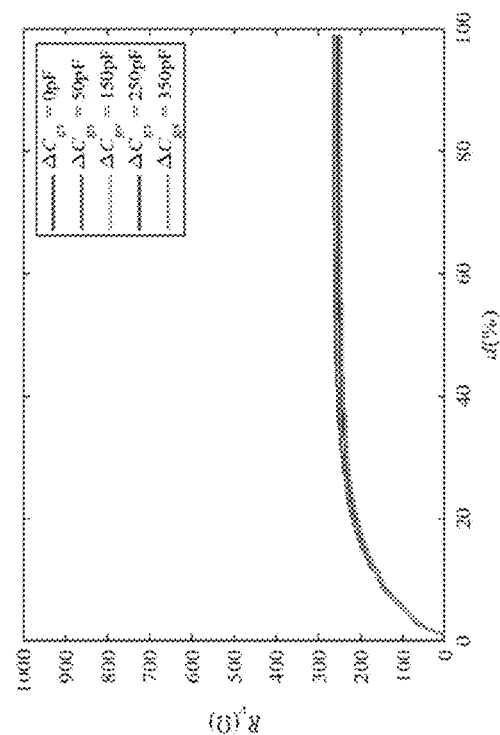
FIG. 7C is a graph showing relationships between the duty cycle d of the switching device M1 and the resistance $R_v$ with different values of capacitances $\Delta C_{gs}$ connected across gate and source terminals of the switching device M1 in the gate drive circuit of FIG. 3.

FIG. 7C shows the relationships between d and $R_v$ with additional capacitance $\Delta C_{gs}$ connected across gate and source terminals. $\Delta C_{gs}$ equals 0 pF, 50 pF, 150 pF, 250 pF and 350 pF to represent different levels of degradation. The value of $V_{REF}$ is set at −4V and $R_{gss}$ is infinitive. The required values of $R_v$ increases as $C_{gs}$ decreases.

Based on FIGS. 7A to 7C, it can be determined that by observing the change of $R_v$ at the considered duty cycle and loading condition, the condition of the switching device can be monitored.

An example design procedure of the signal modulation circuit 302 in FIG. 3 is now presented.

In one embodiment, the values of $C_N$, $C_P$, $R_N$, $R_A$, and $R_B$, are designed by considering the following design criteria:
1) $V_{0,LS,inf}(dT^+)$: Initial off-state gate-source voltage when $R_v \to \infty$, i.e., upon open-circuit fault in $R_v$
2) $V_{0,LS,max}(dT^+)$: Initial off-state gate-source voltage when $R_v = R_{v,max}$ (maximum value of $R_v$)
3) $V_{0,LS,min}(dT^+)$: Initial off-state gate-source voltage when $R_v = 0$ (minimum value of $R_v$)

Step 1 of the design procedure includes design of $R_N$, $R_A$, and $R_B$. By considering the steady-state gate-source voltage with different values of $R_v$, it can be shown that $$\frac{R_A}{R_A+R_N} = \frac{V_{GG}+V_{o,LS,inf}(dT^+)}{V_{GG}} \quad (19)$$

$$\frac{R_A\|(R_B+R_{v,max})}{R_N+(R_A\|(R_B+R_{v,max}))} = \frac{V_{GG}+V_{o,LS,max}(dT^+)}{V_{GG}} \quad (20)$$

$$\frac{R_A\|R_B}{R_N+(R_A\|R_B)} = \frac{V_{GG}+V_{o,LS,min}(dT^+)}{V_{GG}} \quad (21)$$

Thus, $R_N$, $R_A$, and $R_B$ are determined by solving (19), (20), and (21).

Step 2 of the design procedure includes design of $C_P$. In this example the value of $C_P$ is chosen to be at least ten times larger than $C_{gs}$, so that the operation of the level shifter will not be dominated by $C_{gs}$ in Mode 1 operation.

Step 1 of the design procedure includes design of $C_N$. In this example the value of $C_N$ is determined by considering the designed nominal value of $R_v$, $R_{v,norm}$. Thus, the time constants of the two RC networks are designed to be substantially the same. Thus, $$C_N = \frac{(R_{v,norm}+R_B)\|R_A}{R_N}C_P \quad (22)$$

Experimental Verification

The performance of the level shifter of the circuit 300 of FIG. 3 is evaluated on a 1 kW, 400 Vdc/115 Vac full-bridge inverter. The output LC filter is constructed by an inductor $L_0=0.7$ mH and a capacitor $C_0=1$ μF.

Figure 8A:
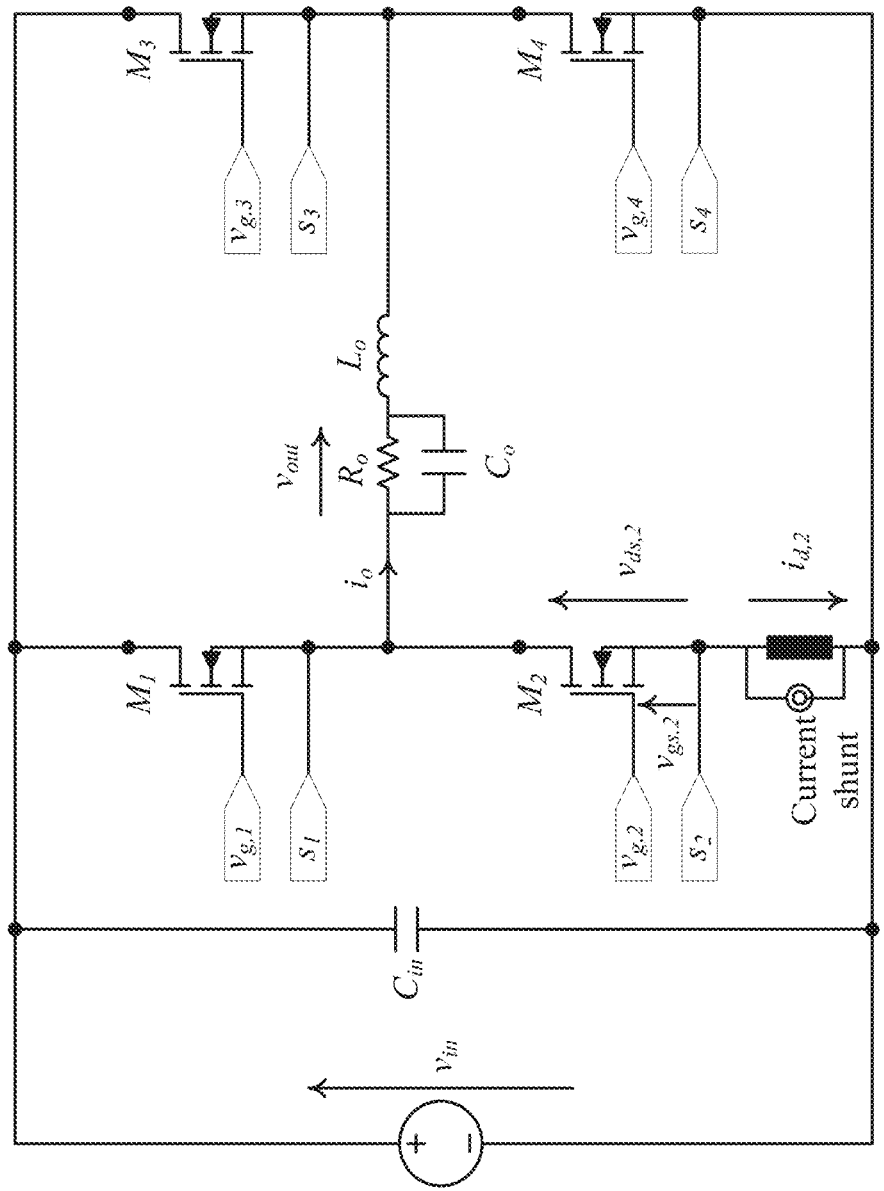
FIG. 8A shows a circuit diagram of a full-bridge inverter in which the level shifter in the gate drive circuit of FIG. 3 is applied (to switching device M2) in one embodiment of the invention.
Figure 8B:
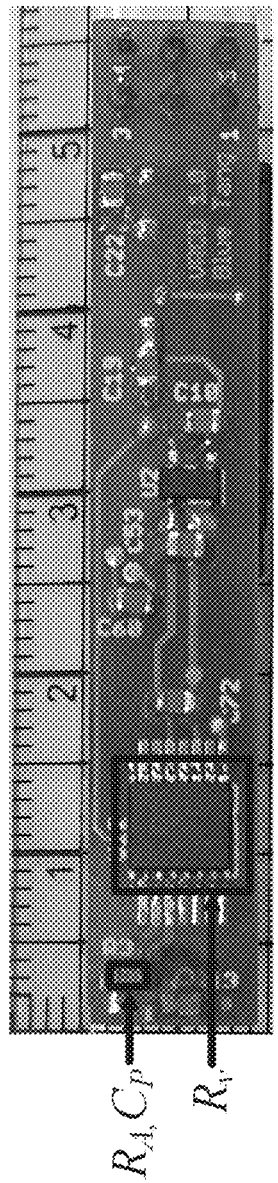
FIG. 8B is a picture showing a top view of the full-bridge inverter circuit including the level shifter in the gate drive circuit of FIG. 3 in one embodiment of the invention.
Figure 8C:
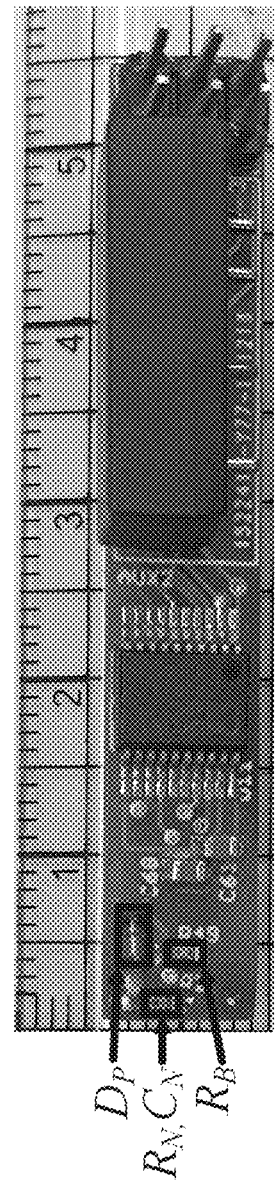
FIG. 8C is a picture showing a bottom view of the full-bridge inverter circuit including the level shifter in the gate drive circuit of FIG. 3 in one embodiment of the invention.

FIG. 8A shows a full-bridge inverter in which the level shifter in the gate drive circuit of FIG. 3 (not shown) is applied to switching device M2. FIGS. 8B and 8C show the full-bridge inverter circuit including the level shifter in the gate drive circuit of FIG. 3 as constructed.

In this example the nominal value of the load resistance $R_L=13.7Ω$. The switching frequency is 45 kHz. All switching devices are CREE C3M0065090J with the threshold voltage of 2.1V and maximum allowable reverse gate–source voltage of −8V. The gate drivers are Skywork SI8233 with the supply voltage of 15V.

In this example, the switching device M2 is connected with the level shifter, while the rest of switching devices are driven by the gate drivers with RCD level shifters, with the voltage shifted downward by 6V. Details of the RCD level shifters can be found in Wang et. al, "A Novel RCD Level Shifter for Elimination of Spurious Turn-on in the Bridge-Leg Configuration", the entire contents of which is incorporated by reference herein.

The level shifter for M2 is designed by following the design procedure described above and the component values are listed in Table II.

Different levels of crosstalk effect are emulated by increasing the equivalent gate-drain capacitance with external capacitors and reducing the equivalent gate-source resistance and capacitance. The system is tested without and with the dynamic gate-source voltage control included.

The effects of $C_{gd}$ is studied.

Figure 9A:
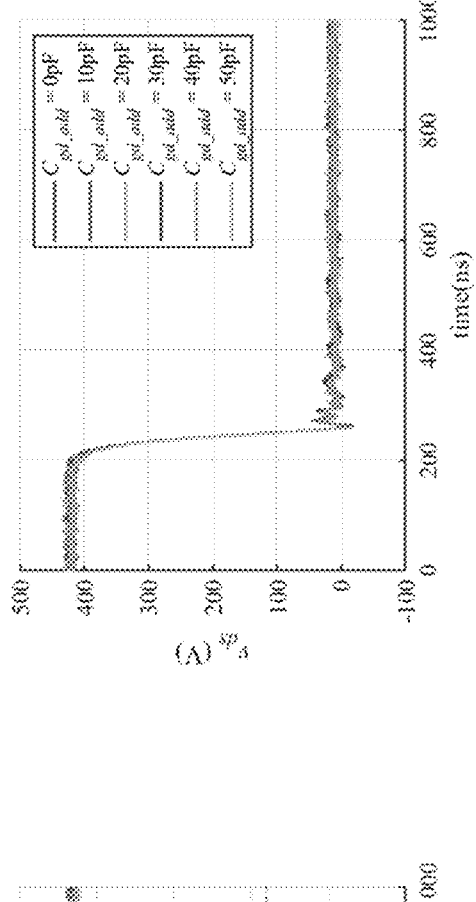
FIG. 9A is a graph showing turn-on waveform of the gate-source voltage $v_{gs,2}$ of the switching device M2 when capacitor $\Delta C_{gd}$ of different capacitances is selectively connected between the gate and drain of the switching device M2 when the gate drive circuit is deactivated.
Figure 9B:
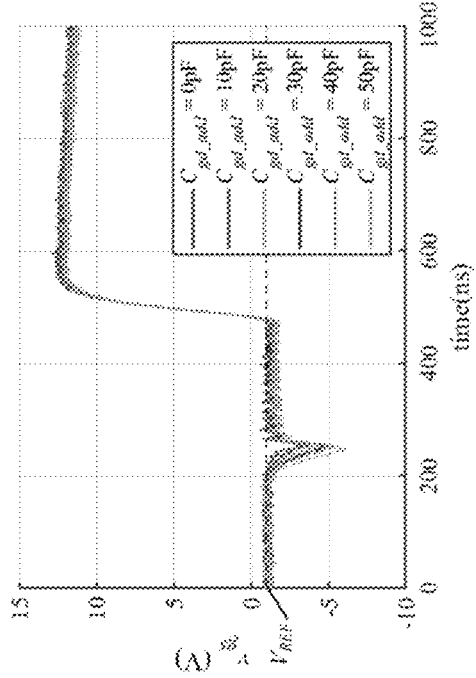
FIG. 9B is a graph showing turn-on waveform of the drain-source voltage $v_{ds,2}$ of the switching device M2 when capacitor $\Delta C_{gd}$ of different capacitances is selectively connected between the gate and drain of the switching device M2 when the gate drive circuit is deactivated.
Figure 9C:
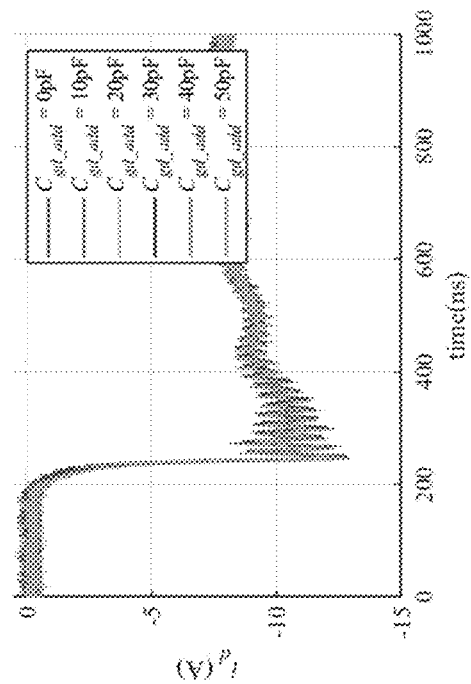
FIG. 9C is a graph showing turn-on waveform of the drain current $i_{d,2}$ of the switching device M2 when capacitor $\Delta C_{gd}$ of different capacitances is selectively connected between the gate and drain of the switching device M2 when the gate drive circuit is deactivated.
Figure 10A:
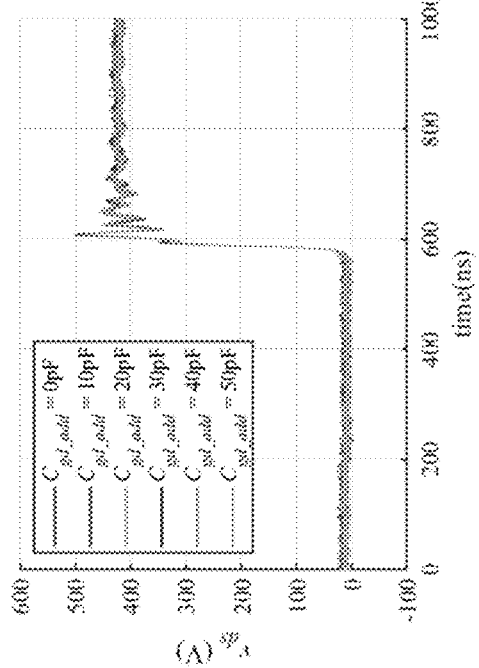
FIG. 10A is a graph showing turn-off waveform of the gate-source voltage $v_{gs,2}$ of the switching device M2 when capacitor $\Delta C_{gd}$ of different capacitances is selectively connected between the gate and drain of the switching device M2 when the gate drive circuit is deactivated.
Figure 10B:
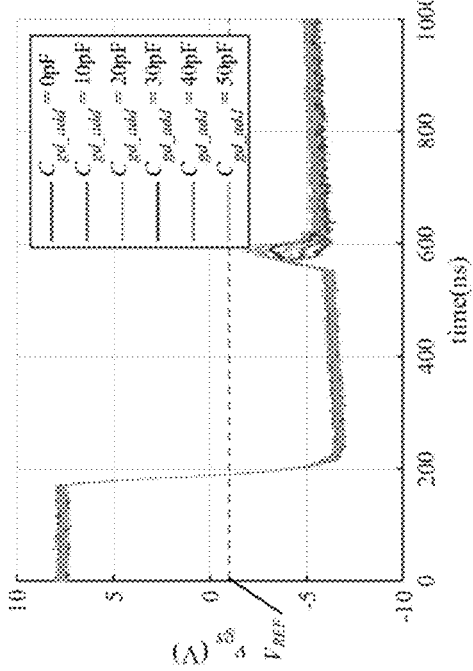
FIG. 10B is a graph showing turn-off waveform of the drain-source voltage $v_{ds,2}$ of the switching device M2 when capacitor $\Delta C_{gd}$ of different capacitances is selectively connected between the gate and drain of the switching device M2 when the gate drive circuit is deactivated.
Figure 10C:
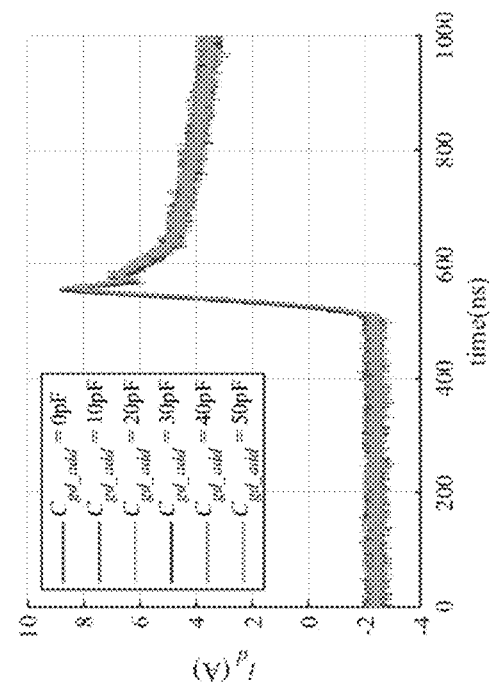
FIG. 10C is a graph showing turn-off waveform of the drain current $i_{d,2}$ of the switching device M2 when capacitor $\Delta C_{gd}$ of different capacitances is selectively connected between the gate and drain of the switching device M2 when the gate drive circuit is deactivated.

The off-state voltage is shifted downward by 6V with the RCD level shifter. FIGS. 9A to 9C respectively show the turn-on waveforms of the gate-source voltage $v_{gs,2}$, drain-source voltage $v_{ds,2}$, and drain current $i_{d,2}$ of M2 when a capacitor $ΔC_{gd}$ is connected between the gate and drain terminals of M2 (when the gate drive circuit is deactivated). The value of $ΔC_{gd}$ under test includes 10 pF, 20 pF, 30 pF, 40 pF, and 50 pF, respectively. FIGS. 10A to 10C respectively show the turn-off waveforms of the gate-source voltage $v_{gs,2}$, drain-source voltage $v_{ds,2}$, and drain current $i_{d,2}$ of M2 when a capacitor $ΔC_{gd}$ is connected between the gate and drain terminals of M2 (when the gate drive circuit is deactivated). The magnitude of the spurious voltage is 0.7V, 1.6V, 2.2V, 2.9V, 3.7V, 4.1V, respectively. Thus, when the externally added capacitor is 50 pF, the off-state gate-source voltage reaches −2V. Thus, with the gate-drain capacitance further increased, undesired shoot through might occur.

Figure 12A:
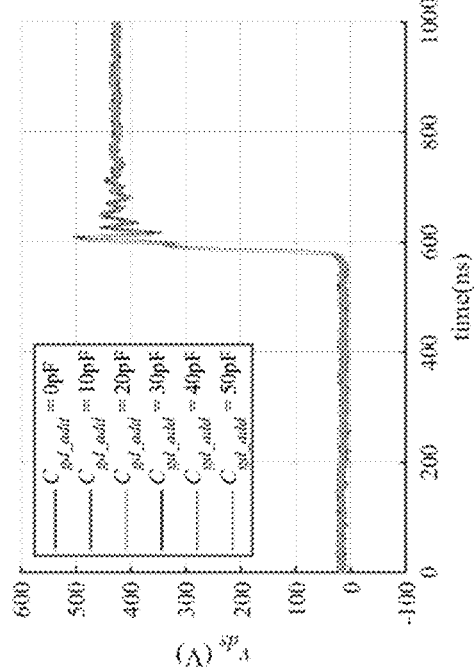
FIG. 12A is a graph showing turn-off waveform of the gate-source voltage $v_{gs,2}$ of the switching device M2 when capacitor $\Delta C_{gd}$ of different capacitances is selectively connected between the gate and drain of the switching device M2 when the gate drive circuit is activated.
Figure 12B:
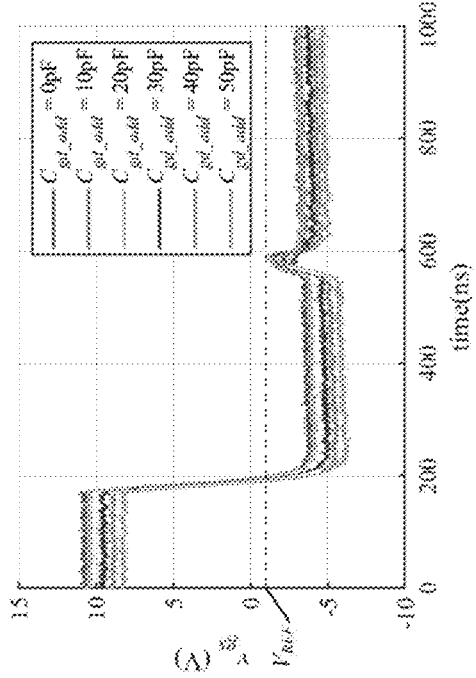
FIG. 12B is a graph showing turn-off waveform of the drain-source voltage $v_{ds,2}$ of the switching device M2 when capacitor $\Delta C_{gd}$ of different capacitances is selectively connected between the gate and drain of the switching device M2 when the gate drive circuit is activated.
Figure 12C:
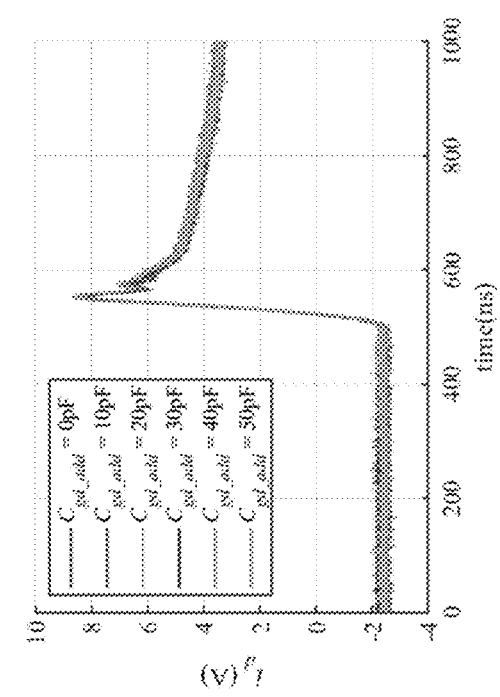
FIG. 12C is a graph showing turn-off waveform of the drain current $i_{d,2}$ of the switching device M2 when capacitor $\Delta C_{gd}$ of different capacitances is selectively connected between the gate and drain of the switching device M2 when the gate drive circuit is activated.

FIGS. 11A to 11C respectively show the turn-on waveforms of the gate-source voltage $v_{gs,2}$, drain-source voltage $v_{ds,2}$, and drain current $i_{d,2}$ of M2 when a capacitor $ΔC_{gd}$ is connected between the gate and drain terminals of M2 (when the gate drive circuit is activated). FIGS. 12A to 12C respectively show the turn-off waveforms of the gate-source voltage $v_{gs,2}$, drain-source voltage $v_{ds,2}$, and drain current $i_{d,2}$ of M2 when a capacitor $ΔC_{gd}$ is connected between the gate and drain terminals of M2 (when the gate drive circuit is activated). It can be seen that with the off-state gate-source voltage control activated, the spurious voltage is regulated below −1V, i.e., $V_{REF}=-1V$.

Comparing FIGS. 9A-9C with FIGS. 11A-11C, the profiles of the gate-source voltage are generally similar, both are close to zero near the end of the switching cycle.

FIGS. 12A to 12C shows that, depending on the value of $ΔC_{gd}$, $v_{gs,2}$ varies between −3.5V and −6.4V immediately after turning off. The peak off-state gate voltage caused by the crosstalk is kept at −1V by decreasing $R_v$. It gradually increases until the end of switching cycle. Hence, this can reduce the average voltage stress on the gate oxide.

Table III shows a comparison of the measured power losses of M2 with the dynamic and fixed off-state voltage control, respectively.

TABLE III

Power Losses of M2 under Different $ΔC_{gd}$

| $ΔC_{gd}$ (pF) | $P_{L,act}$*(W) | $P_{L,deact}$*(W) | $ΔP_L$ (%) |
|---|---|---|---|
| 0 | 12.5 | 12.8 | 2.2 |
| 10 | 12.4 | 12.6 | 1.4 |
| 20 | 12.2 | 12.7 | 3.6 |

TABLE III-continued

Power Losses of M2 under Different $\Delta C_{gd}$

| $\Delta C_{gd}$ (pF) | $P_{L,act}$*(W) | $P_{L,deact}$*(W) | $\Delta P_L$ (%) |
|---|---|---|---|
| 30 | 12.3 | 12.8 | 3.4 |
| 40 | 12.9 | 13.3 | 3.3 |
| 50 | 13.8 | 14.5 | 4.5 |

*Note:
$P_{L,act}$: Power loss of M2 with the dynamic gate-source voltage control activated
$P_{L,deact}$: Power loss of M2 with the dynamic gate-source voltage control deactivated $\Delta P_L$: Percentage difference, $\Delta P_L = \dfrac{(P_{L,deact}-P_{L,act}) \times 100\%}{P_{L,act}}$ The results show that the dynamic one gives a lower power loss than the fixed one. When $\Delta C_{gd}$=50 pF, the gate-source voltage with dynamic and fixed off-state voltage control are designed to be the same under this worst-case condition. When the switch is in control mode, the power dissipation is lower with the dynamic off-state voltage control than the fixed one, because the on-state resistance and the off-state voltage stress are also reduced.

The dynamic control gives lower power losses for at least two reasons. First, the on-state gate-source voltage can dynamically change with $C_{gd}$. Upon the reduction of $C_{gd}$, the gate-source voltage is increased. Thus, the power loss reduces as the on-state resistance reduces. Second, as the off-state gate-source voltage is reduced dynamically, the reverse conduction loss can also be reduced.

The effect of $R_{gss}$ is studied.

Figure 13A:
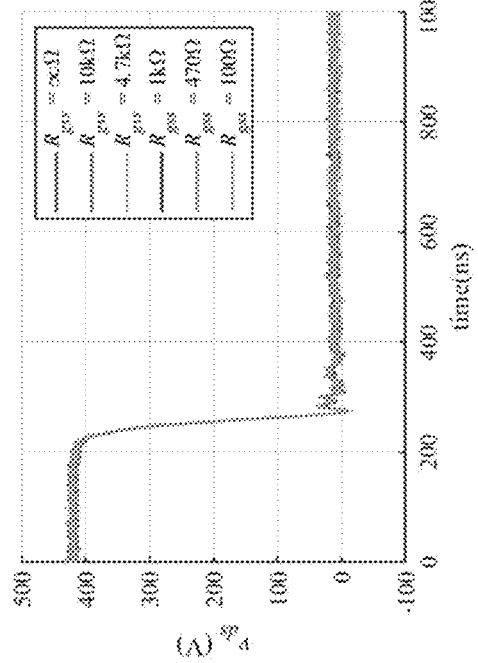
FIG. 13A is a graph showing turn-on waveform of the gate-source voltage $v_{gs,2}$ of the switching device M2 when resistor $R_{gss}$ of different resistances is selectively connected between the gate and source of the switching device M2 when the gate drive circuit is deactivated.
Figure 13B:
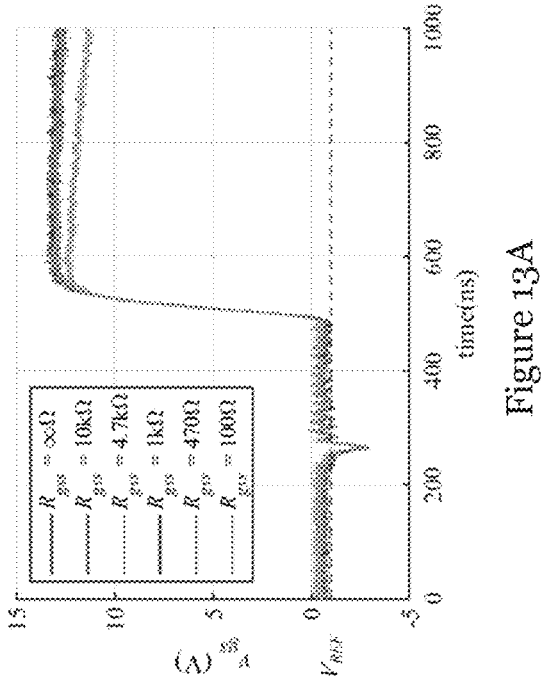
FIG. 13B is a graph showing turn-on waveform of the drain-source voltage $v_{ds,2}$ of the switching device M2 when resistor $R_{gss}$ of different resistances is selectively connected between the gate and source of the switching device M2 when the gate drive circuit is deactivated.
Figure 13C:
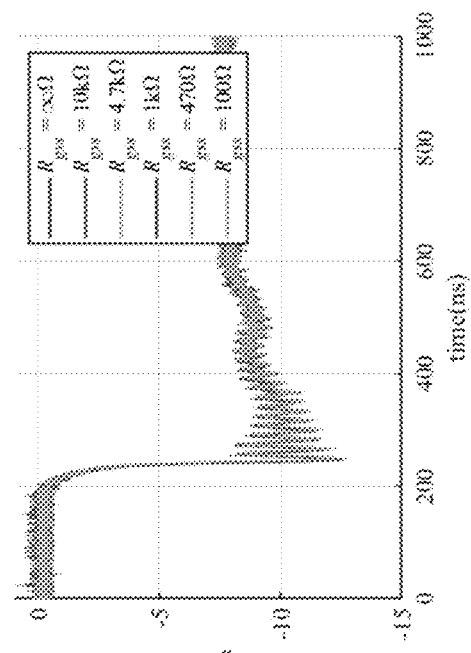
FIG. 13C is a graph showing turn-on waveform of the drain current $i_{d,2}$ of the switching device M2 when resistor $R_{gss}$ of different resistances is selectively connected between the gate and source of the switching device M2 when the gate drive circuit is deactivated.

FIGS. 13A to 13C show the turn-on waveforms when a resistor $R_{gss}$ is connected between the gate and source of M2 (when the gate drive circuit is deactivated). The value of $R_{gss}$ is 10 kΩ, 4.7 kΩ, 1 kΩ, 470Ω, and 100Ω, respectively. The magnitude of the spurious voltage slightly reduces as $R_{gss}$ reduces.

Figure 14A:
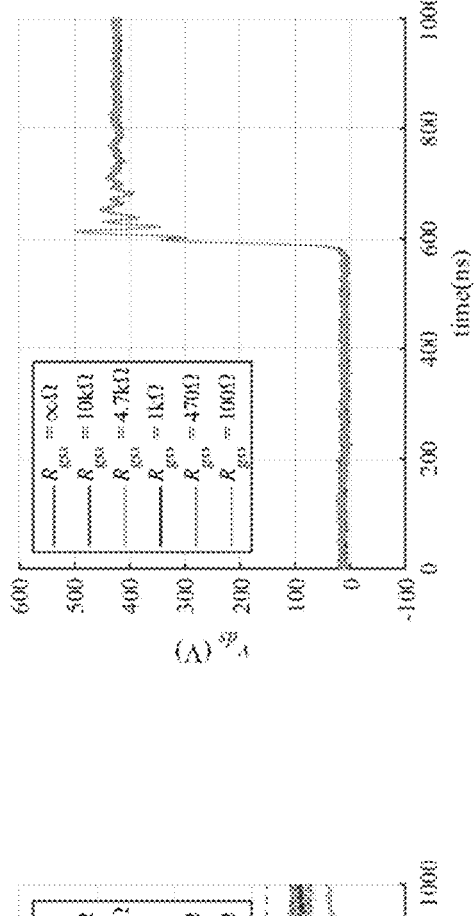
FIG. 14A is a graph showing turn-off waveform of the gate-source voltage $v_{gs,2}$ of the switching device M2 when resistor $R_{gss}$ of different resistances is selectively connected between the gate and source of the switching device M2 when the gate drive circuit is deactivated.
Figure 14B:
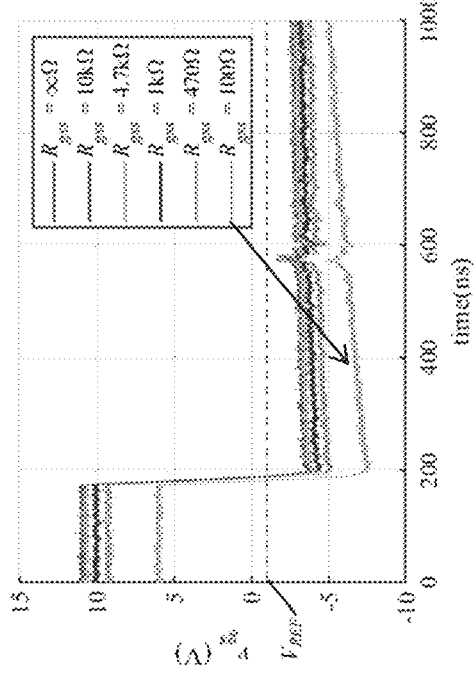
FIG. 14B is a graph showing turn-off waveform of the drain-source voltage $v_{ds,2}$ of the switching device M2 when resistor $R_{gss}$ of different resistances is selectively connected between the gate and source of the switching device M2 when the gate drive circuit is deactivated.
Figure 14C:
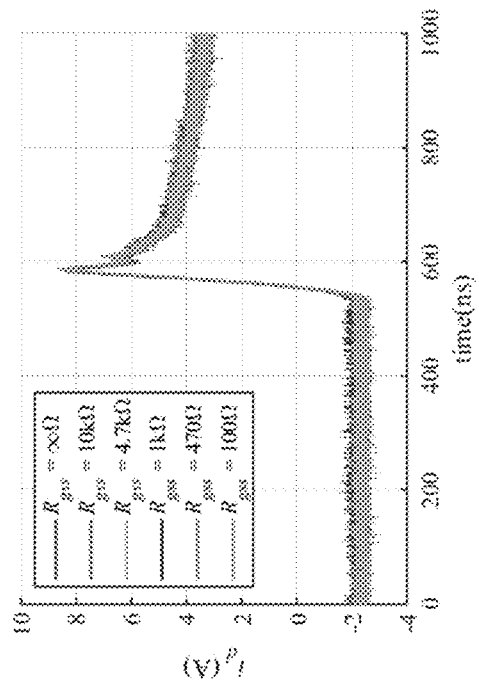
FIG. 14C is a graph showing turn-off waveform of the drain current $i_{d,2}$ of the switching device M2 when resistor $R_{gss}$ of different resistances is selectively connected between the gate and source of the switching device M2 when the gate drive circuit is deactivated.

FIGS. 14A to 14C show the turn-off waveforms when a resistor $R_{gss}$ is connected between the gate and source of M2 (when the gate drive circuit is deactivated). When $R_{gss}$=100Ω, the on-state gate-source voltage drops to 6V while the off-state gate-source voltage drops to −8V. It is mainly due to the loading effect of $R_{gss}$ on the level shifter. Thus, the off-state voltage stress on the gate oxide of the switching device increases.

Figure 15B:
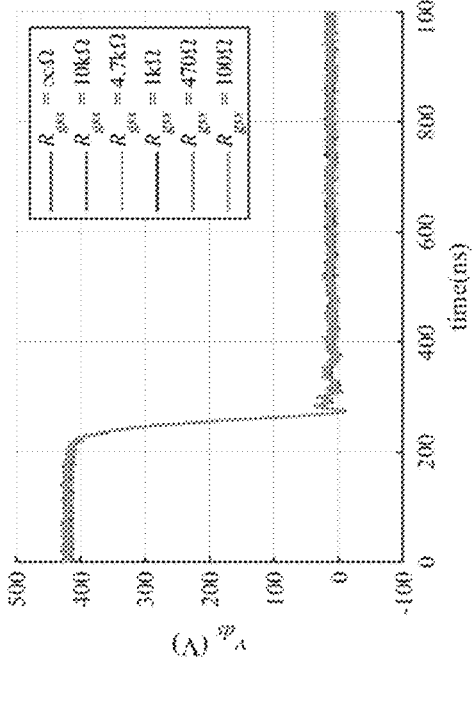
FIG. 15B is a graph showing turn-on waveform of the drain-source voltage $v_{ds,2}$ of the switching device M2 when resistor $R_{gss}$ of different resistances is selectively connected between the gate and source of the switching device M2 when the gate drive circuit is activated.
Figure 15A:
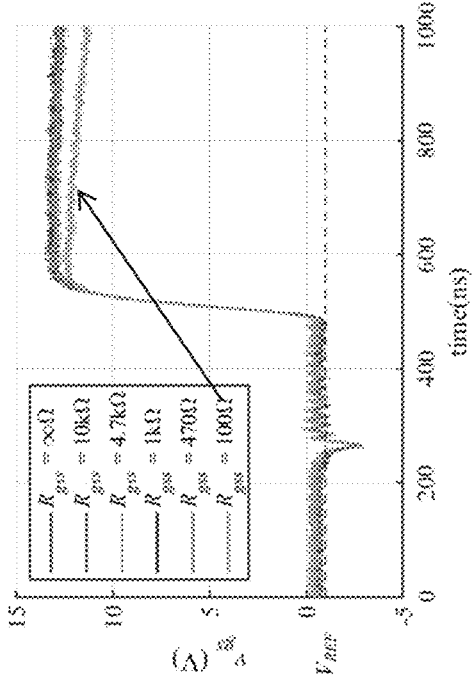
FIG. 15A is a graph showing turn-on waveform of the gate-source voltage $v_{gs,2}$ of the switching device M2 when resistor $R_{gss}$ of different resistances is selectively connected between the gate and source of the switching device M2 when the gate drive circuit is activated.
Figure 15C:
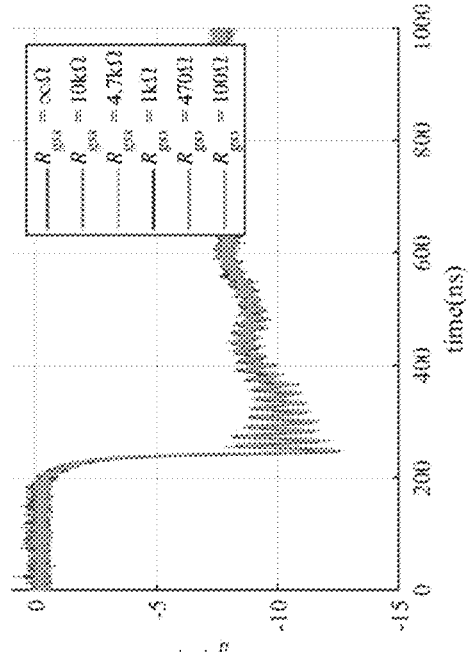
FIG. 15C is a graph showing turn-on waveform of the drain current $i_{d,2}$ of the switching device M2 when resistor $R_{gss}$ of different resistances is selectively connected between the gate and source of the switching device M2 when the gate drive circuit is activated.
Figure 16A:
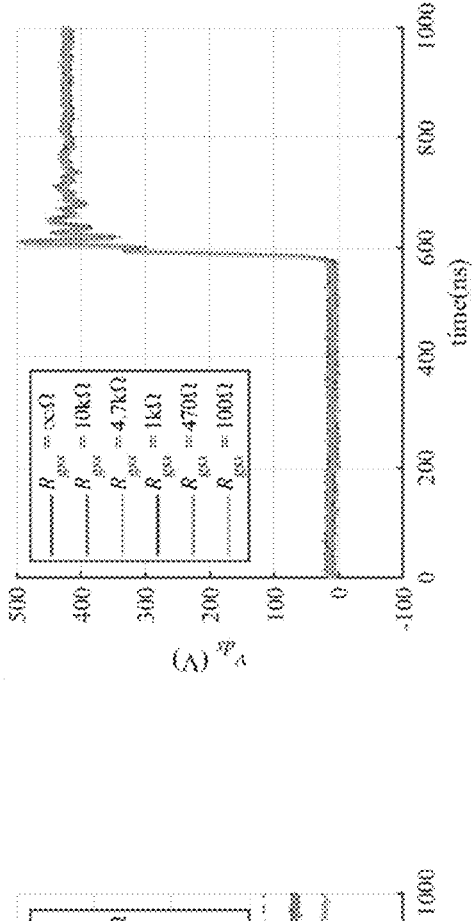
FIG. 16A is a graph showing turn-off waveform of the gate-source voltage $v_{gs,2}$ of the switching device M2 when resistor $R_{gss}$ of different resistances is selectively connected between the gate and source of the switching device M2 when the gate drive circuit is activated.
Figure 16B:
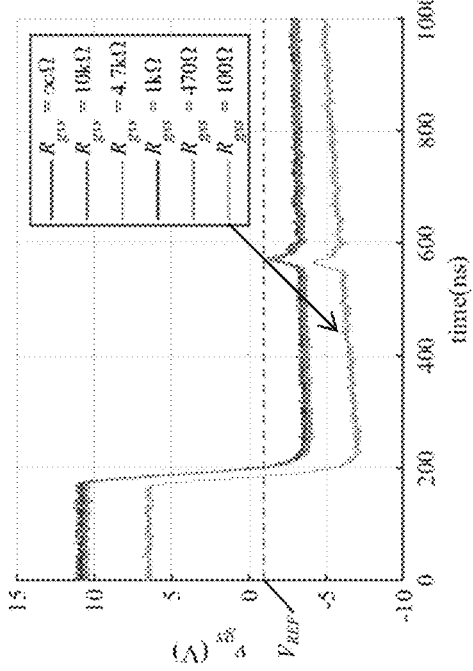
FIG. 16B is a graph showing turn-off waveform of the drain-source voltage $v_{ds,2}$ of the switching device M2 when resistor $R_{gss}$ of different resistances is selectively connected between the gate and source of the switching device M2 when the gate drive circuit is activated.
Figure 16C:
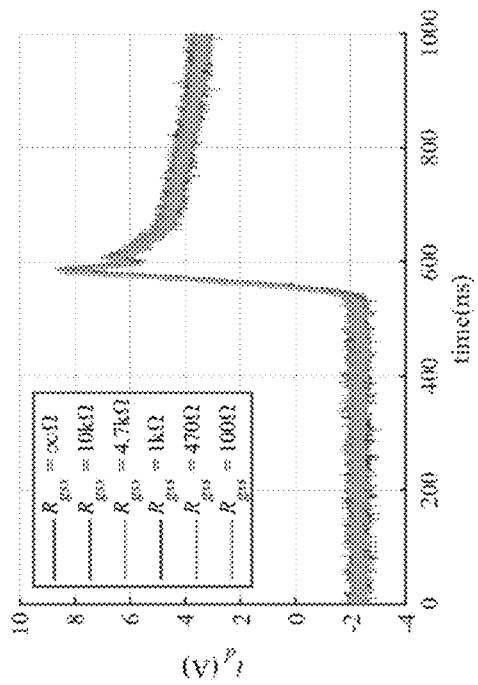
FIG. 16C is a graph showing turn-off waveform of the drain current $i_{d,2}$ of the switching device M2 when resistor $R_{gss}$ of different resistances is selectively connected between the gate and source of the switching device M2 when the gate drive circuit is activated.

FIGS. 15A to 15C show the turn-on waveforms when a resistor $R_{gss}$ is connected between the gate and source of M2 (when the gate drive circuit is activated). FIGS. 16A to 16C show the turn-off waveforms when a resistor $R_{gss}$ is connected between the gate and source of M2 (when the gate drive circuit is activated).

Comparing FIGS. 15A-15C with FIGS. 13A-13C, the profiles of the gate-source voltage under different $R_{gss}$ are similar, both are close to zero near the end of the switching cycle. FIGS. 15A-15C show that the off-state gate-source voltage control keeps $v_{gs,2}$ at −2.4V immediately after turning off the switch with $R_{gss}$ varying between 470Ω and 10 kΩ, giving rise a lower off-state voltage on the gate oxide. The peak off-state gate-source voltage caused by the crosstalk is also regulated at −1V by reducing $R_v$. With $R_{gss}$=100Ω (an extreme case), the control fails to perform the regulation. Thus, based on observing the value of $R_v$, it is possible to monitor the change of $R_{gss}$.

Table IV shows a comparison of the measured power losses of M2 with the dynamic and fixed off-state voltage control, respectively, when $R_{gss}$ is reduced from ∞ to 100Ω.

TABLE IV

Power Losses of M2 under Different $R_{gss}$

| $R_{gss}$ (Ω) | $P_{L,act}$*(W) | $P_{L,deact}$*(W) | $\Delta P_L$ (%) |
|---|---|---|---|
| ∞ | 11.8 | 12.2 | 3.4 |
| 10k | 11.7 | 12.6 | 7.7 |
| 4.7k | 11.8 | 12.5 | 5.9 |
| 1k | 11.8 | 12.8 | 8.5 |
| 470 | 11.8 | 12.9 | 9.3 |
| 100 | 13.3 | 14.5 | 9 |

*Note:
$P_{L,act}$: Power loss of M2 with the dynamic gate-source voltage control activated
$P_{L,deact}$: Power loss of M2 with the dynamic gate-source voltage control deactivated $\Delta P_L$: Percentage difference, $\Delta P_L = \dfrac{(P_{L,deact}-P_{L,act}) \times 100\%}{P_{L,act}}$ The dynamic one gives a lower power loss than the fixed one for two main reasons. First, the on-state gate-source voltage is dynamically changed with $R_{gss}$. Upon the reduction of $R_{gss}$, $R_v$ is increased to regulate the gate-source voltage. The on-state gate-source voltage is higher. Thus, the power loss is lower. Second, as the off-state gate-source voltage is reduced dynamically, the reverse conduction loss can also be reduced.

The effect of $C_{gs}$ is studied.

Figure 17A:
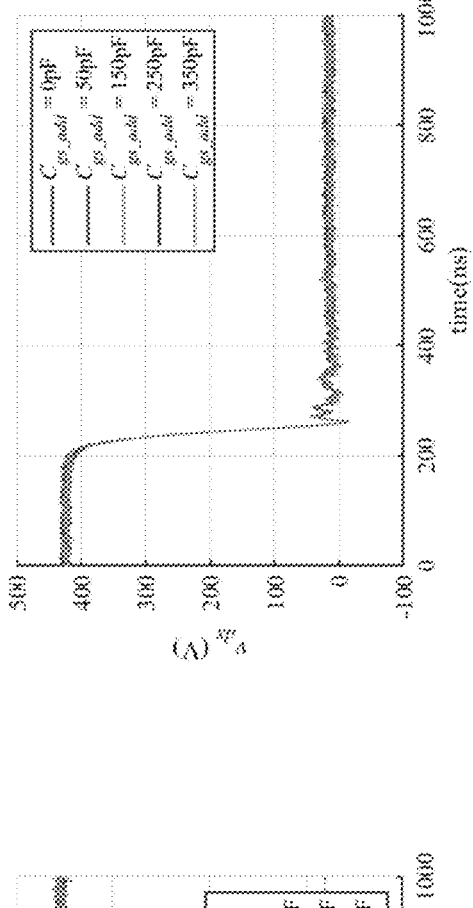
FIG. 17A is a graph showing turn-on waveform of the gate-source voltage $v_{gs,2}$ of the switching device M2 when capacitor $\Delta C_{gs}$ of different capacitances is selectively connected between the gate and source of the switching device M2 when the gate drive circuit is deactivated.
Figure 17B:
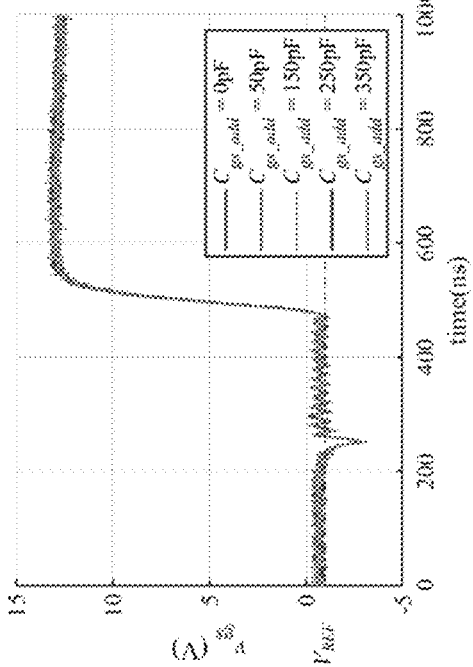
FIG. 17B is a graph showing turn-on waveform of the drain-source voltage $v_{ds,2}$ of the switching device M2 when capacitor $\Delta C_{gs}$ of different capacitances is selectively connected between the gate and source of the switching device M2 when the gate drive circuit is deactivated.
Figure 17C:
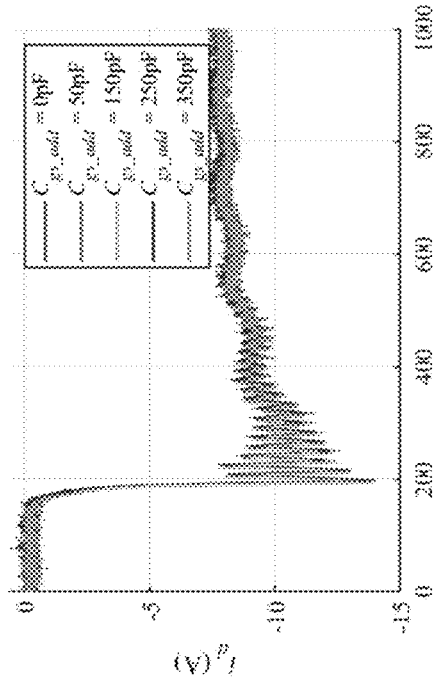
FIG. 17C is a graph showing turn-on waveform of the drain current $i_{d,2}$ of the switching device M2 when capacitor $\Delta C_{gs}$ of different capacitances is selectively connected between the gate and source of the switching device M2 when the gate drive circuit is deactivated.
Figure 18A:
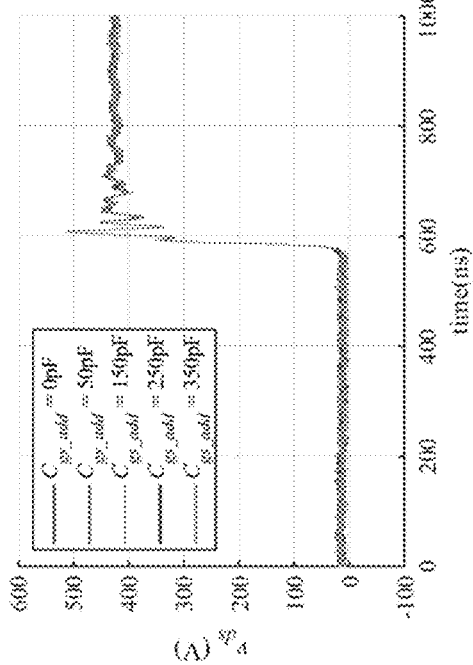
FIG. 18A is a graph showing turn-off waveform of the gate-source voltage $v_{gs,2}$ of the switching device M2 when capacitor $\Delta C_{gs}$ of different capacitances is selectively connected between the gate and source of the switching device M2 when the gate drive circuit is deactivated.
Figure 18B:
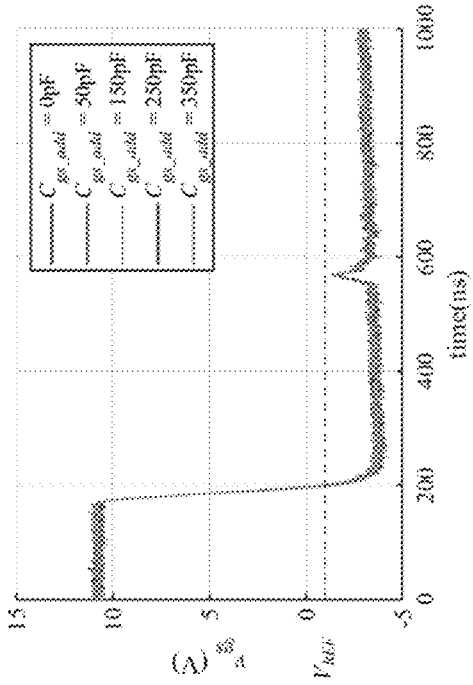
FIG. 18B is a graph showing turn-off waveform of the drain-source voltage $v_{ds,2}$ of the switching device M2 when capacitor $\Delta C_{gs}$ of different capacitances is selectively connected between the gate and source of the switching device M2 when the gate drive circuit is deactivated.
Figure 18C:
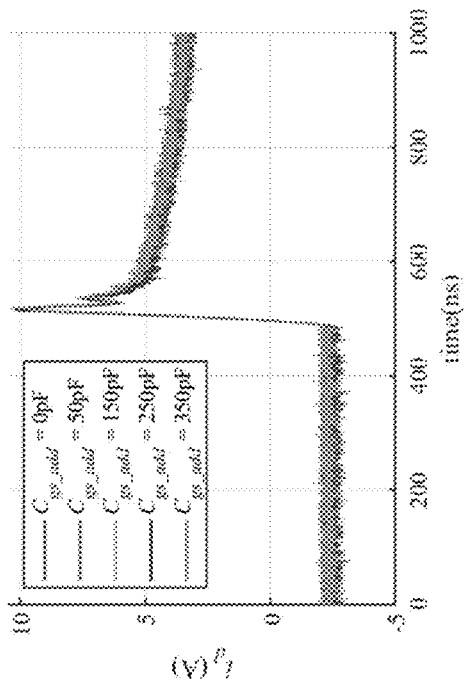
FIG. 18C is a graph showing turn-off waveform of the drain current $i_{d,2}$ of the switching device M2 when capacitor $\Delta C_{gs}$ of different capacitances is selectively connected between the gate and source of the switching device M2 when the gate drive circuit is deactivated.

FIGS. 17A to 17C show the turn-on waveforms when a capacitor is connected between the gate and source terminals of M2 (when the gate drive circuit is deactivated). FIGS. 18A to 18C show the turn-off waveforms when a capacitor is connected between the gate and source terminals of M2 (when the gate drive circuit is deactivated). The value of $\Delta C_{gs}$ under test includes 0 pF, 50 pF, 150 pF, 250 pF and 350 pF, respectively. It has a little effect on the magnitude of the spurious voltage. The on-state gate-source voltage is also kept at 10V at the end of the switching cycle in all cases. Since $C_P$ is designed to be much larger than gate-source capacitance, the value of $\Delta C_{gs}$ gives little impact on the equivalent capacitance in Mode 1.

Figure 19A:
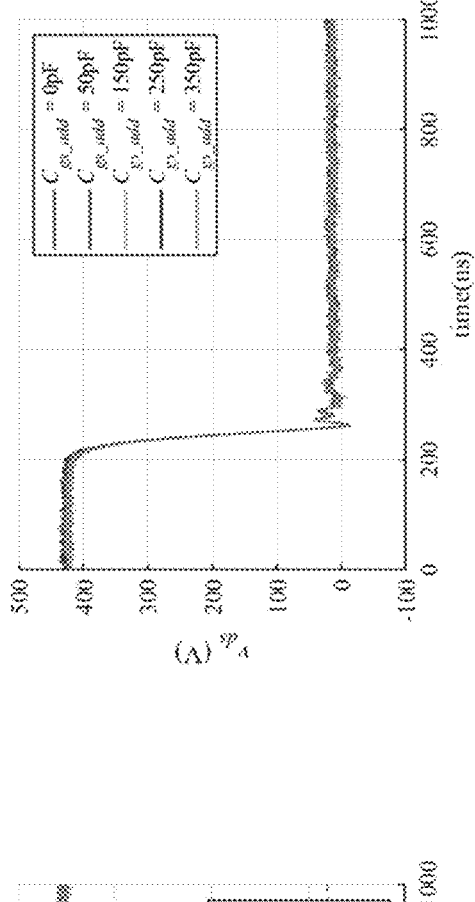
FIG. 19A is a graph showing turn-on waveform of the gate-source voltage $v_{gs,2}$ of the switching device M2 when capacitor $\Delta C_{gs}$ of different capacitances is selectively connected between the gate and source of the switching device M2 when the gate drive circuit is activated.
Figure 19B:
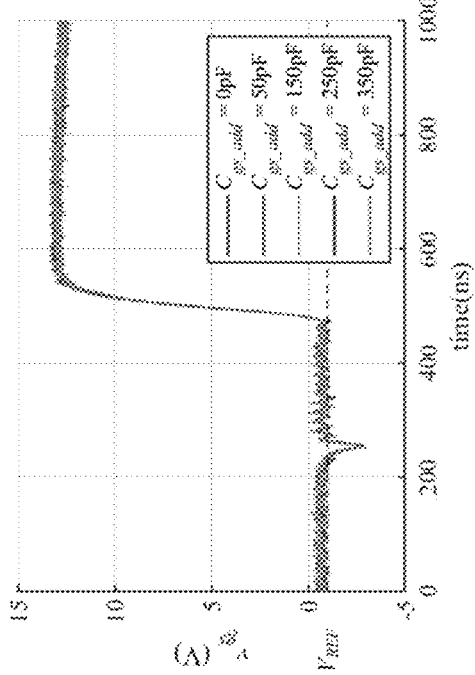
FIG. 19B is a graph showing turn-on waveform of the drain-source voltage $v_{ds,2}$ of the switching device M2 when capacitor $\Delta C_{gs}$ of different capacitances is selectively connected between the gate and source of the switching device M2 when the gate drive circuit is activated.
Figure 19C:
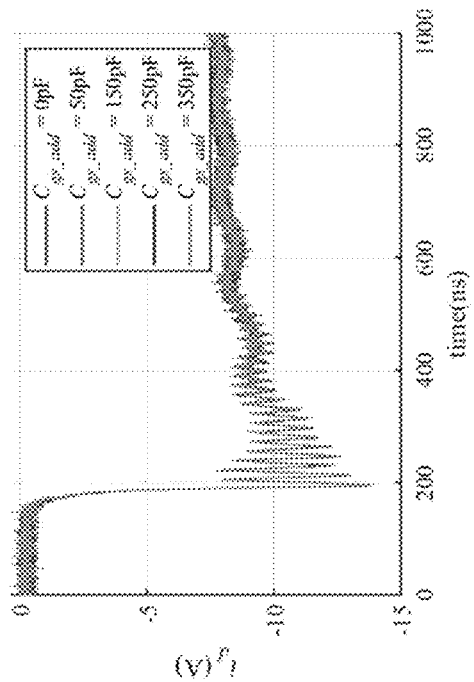
FIG. 19C is a graph showing turn-on waveform of the drain current $i_{d,2}$ of the switching device M2 when capacitor $\Delta C_{gs}$ of different capacitances is selectively connected between the gate and source of the switching device M2 when the gate drive circuit is activated.
Figure 20A:
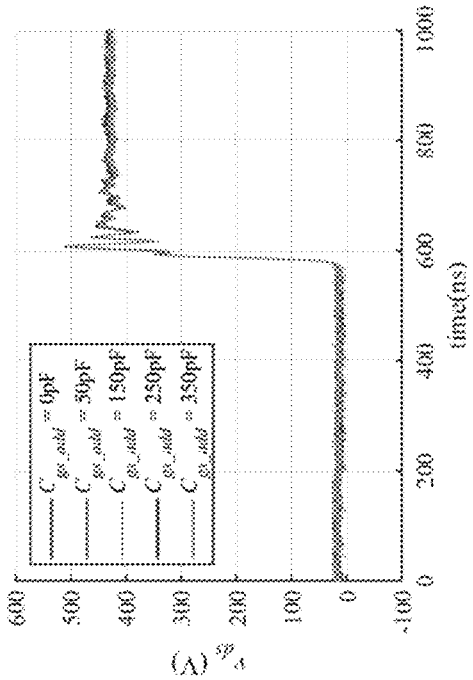
FIG. 20A is a graph showing turn-off waveform of the gate-source voltage $v_{gs,2}$ of the switching device M2 when capacitor $\Delta C_{gs}$ of different capacitances is selectively connected between the gate and source of the switching device M2 when the gate drive circuit is activated.
Figure 20B:
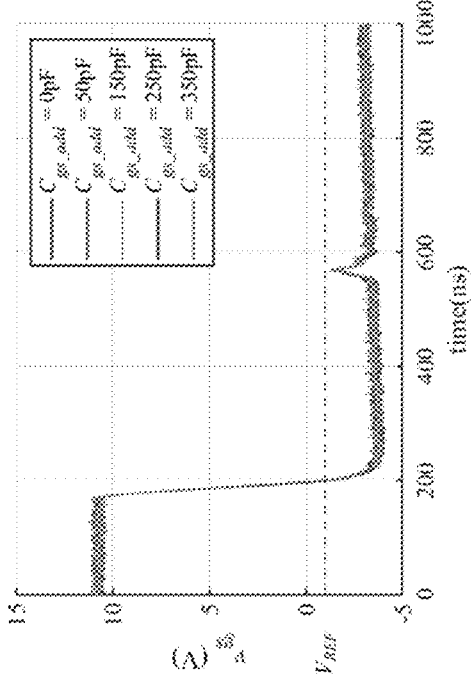
FIG. 20B is a graph showing turn-off waveform of the drain-source voltage $v_{ds,2}$ of the switching device M2 when capacitor $\Delta C_{gs}$ of different capacitances is selectively connected between the gate and source of the switching device M2 when the gate drive circuit is activated.
Figure 20C:
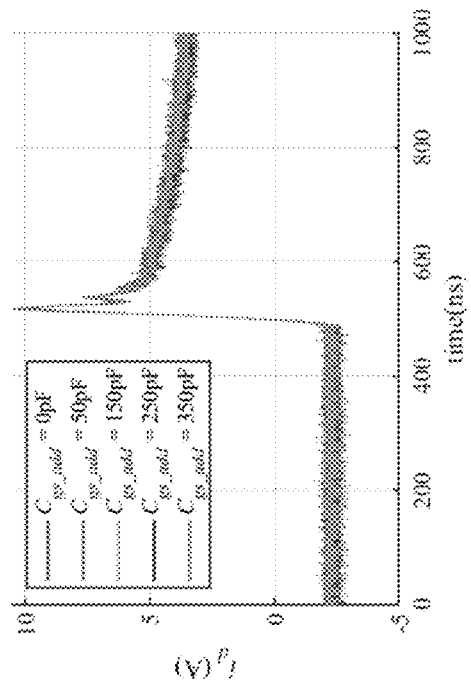
FIG. 20C is a graph showing turn-off waveform of the drain current $i_{d,2}$ of the switching device M2 when capacitor $\Delta C_{gs}$ of different capacitances is selectively connected between the gate and source of the switching device M2 when the gate drive circuit is activated.

FIGS. 19A to 19C show the turn-on waveforms when a capacitor is connected between the gate and source terminals of M2 (when the gate drive circuit is activated). FIGS. 20A to 20C show the turn-off waveforms when a capacitor is connected between the gate and source terminals of M2 (when the gate drive circuit is activated). The spurious voltage is regulated below −1V. Comparing FIGS. 19A-19C with FIGS. 17A-17C, the profiles of the gate-source voltage are similar, both are close to zero near the end of the switching cycle. Comparing FIGS. 20A-20C with FIGS. 18A-18C. The profiles of the gate-source voltage are all similar, irrespective to $\Delta C_{gs}$, showing that $\Delta C_{gs}$ has limited loading effect on the circuit.

Table V shows a comparison of the measured power losses of M2 with the dynamic and fixed off-state voltage control, respectively. As $\Delta C_{gs}$ increases, the turn-on and turn-off times are both increased, resulting in a higher switching loss. As the dynamic off-state voltage control does not change the turn-on and turn-off waveforms, the power losses with the dynamic and fixed off-state voltage control are not affected much.

TABLE V

Power Loss on the Switch for Variable $C_{gs}$

| $\Delta C_{gs}$ (pF) | $P_{L,act}$*(W) | $P_{L,deact}$*(W) | $\Delta P_L$ (%) |
|---|---|---|---|
| 0 | 12.6 | 12.7 | 0.4 |
| 50 | 12.5 | 12.6 | 0.9 |
| 150 | 12.7 | 12.8 | 0.7 |
| 250 | 13.2 | 13.1 | −0.8 |
| 350 | 13.3 | 13.3 | 0.2 |

Figure 21A:
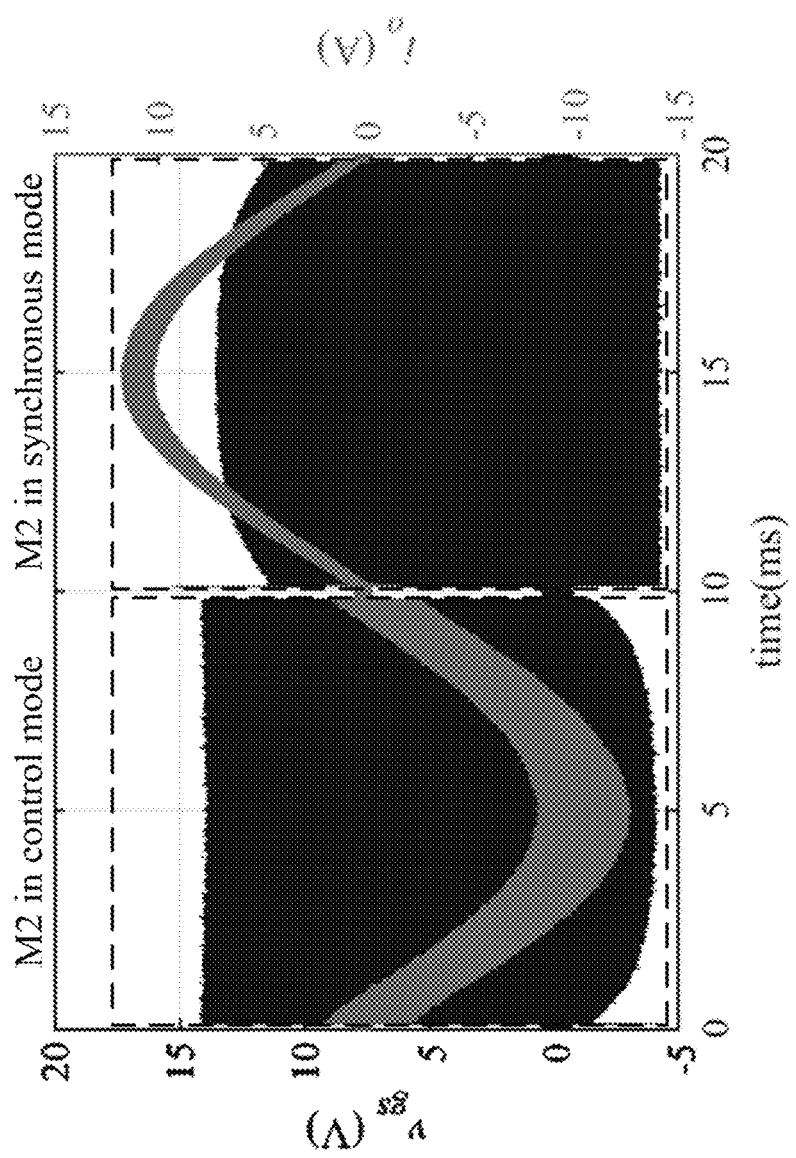
FIG. 21A is a graph showing waveforms of gate-source voltage $v_{gs,2}$ and inverter output current $i_o$ over one line cycle of the switching device M2 when the gate drive circuit is deactivated.
Figure 21B:
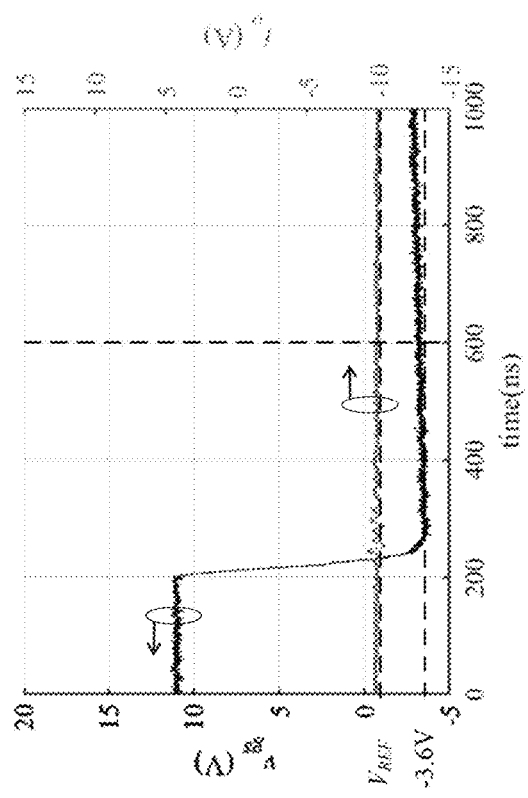
FIG. 21B is a graph showing waveforms of gate-source voltage $v_{gs,2}$ of the switching device M2 in control mode when the inverter output current $i_o$ is at about 2 A and the gate drive circuit is deactivated.
Figure 21C:
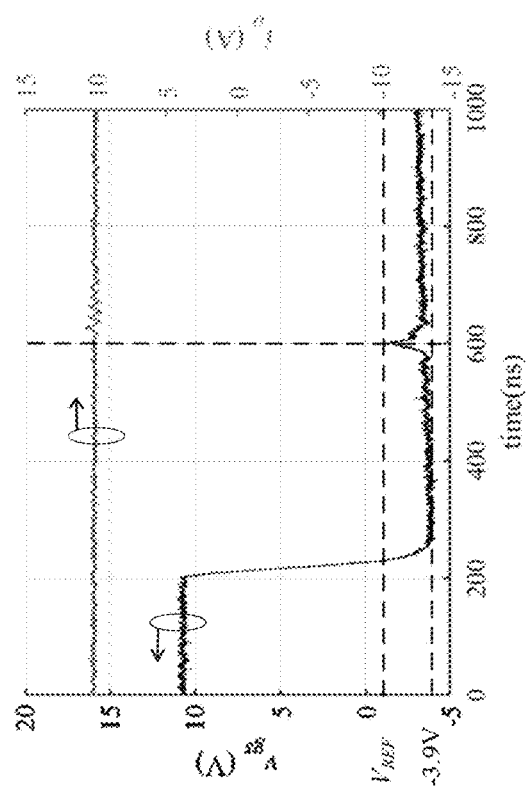
FIG. 21C is a graph showing waveforms of gate-source voltage $v_{gs,2}$ of the switching device M2 in control mode when the inverter output current $i_0$ is at about 10 A and the gate drive circuit is deactivated.
Figure 21D:
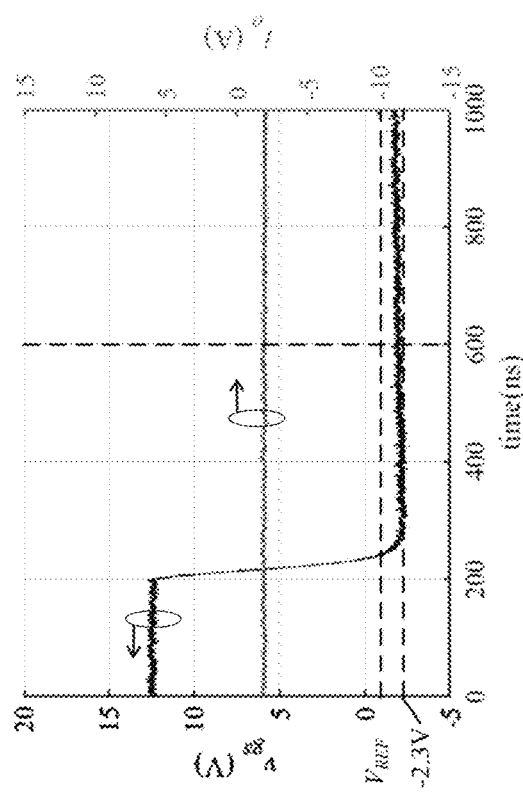
FIG. 21D is a graph showing waveforms of gate-source voltage $v_{gs,2}$ of the switching device M2 in synchronous mode when the inverter output current $i_0$ is at about 2 A and the gate drive circuit is deactivated.
Figure 21E:
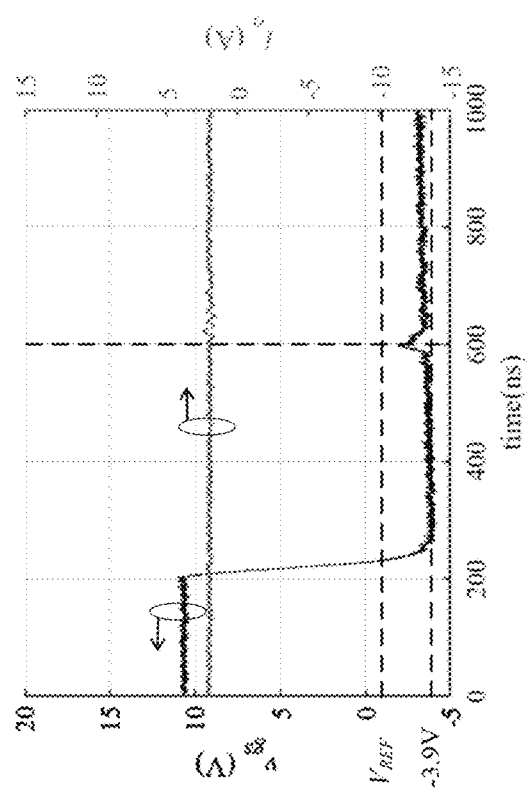
FIG. 21E is a graph showing waveforms of gate-source voltage $v_{gs,2}$ of the switching device M2 in synchronous mode when the inverter output current $i_0$ is at about 10 A and the gate drive circuit is deactivated.

*Note:
$P_{L,act}$: Power loss of M2 with the dynamic gate-source voltage control activated
$P_{L,deact}$: Power loss of M2 with the dynamic gate-source voltage control deactivated
$\Delta P_L$: Percentage difference, $\Delta P_L = \dfrac{(P_{L,deact} - P_{L,act}) \times 100\%}{P_{L,act}}$ FIGS. 21A to 21E illustrate the situation without the gate driver (or not operating). FIG. 21A shows the waveforms of $v_{gs,2}$ and the inverter output current $i_o$ over one line cycle. FIGS. 21B and 21C show the waveforms when $i_o \cong -2$ A and $i_o \cong -10$ A, respectively, and M2 is in control mode. FIGS. 21D and 21E show the waveforms when $i_o \cong -2$ A and $i_o \cong -10$ A, respectively, and M2 is in synchronous mode. Due to the load current variation, the magnitude of the spurious voltage varies accordingly. FIG. 21C shows a more negative off-state voltage than that in FIG. 21B, because of the difference in the duty cycle. FIG. 21D shows that the peak spurious voltage is below $V_{REF}$, while FIG. 21E shows that the peak spurious voltage is the same as $V_{REF}$.

Figure 22A:
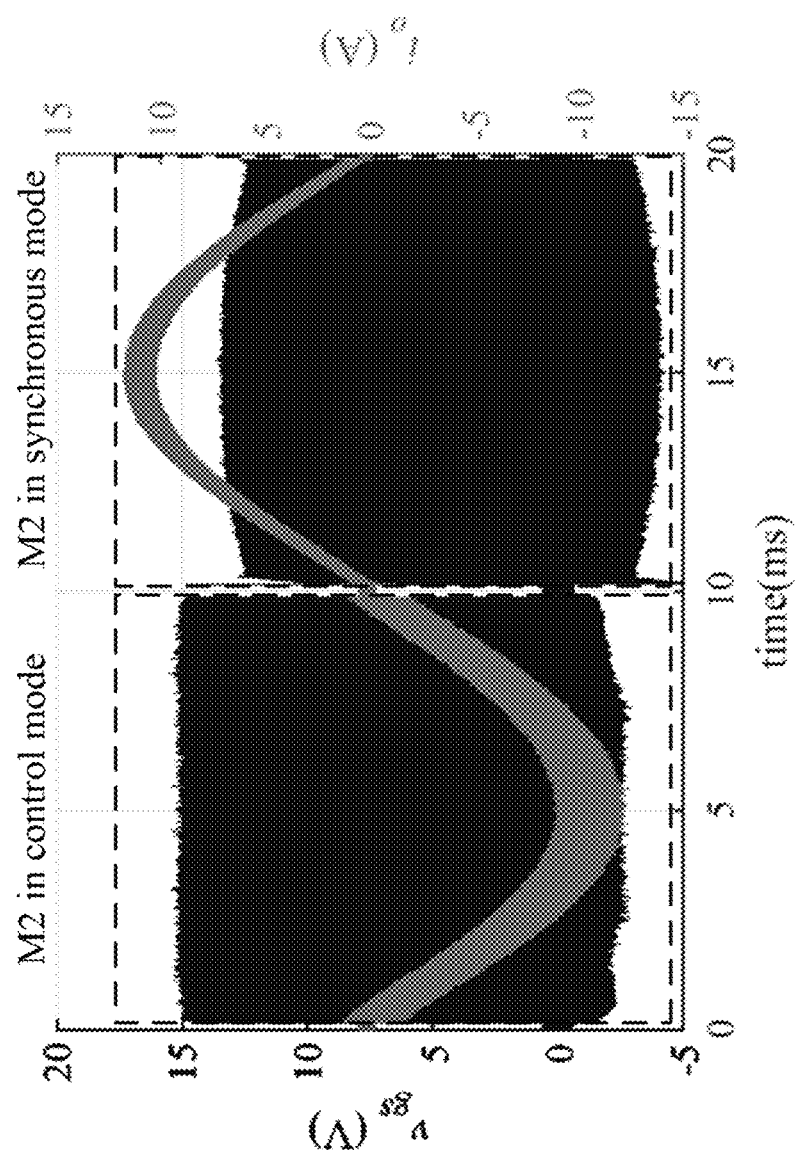
FIG. 22A is a graph showing waveforms of gate-source voltage $v_{gs,2}$ and inverter output current $i_0$ over one line cycle of the switching device M2 when the gate drive circuit is activated.
Figure 22C:
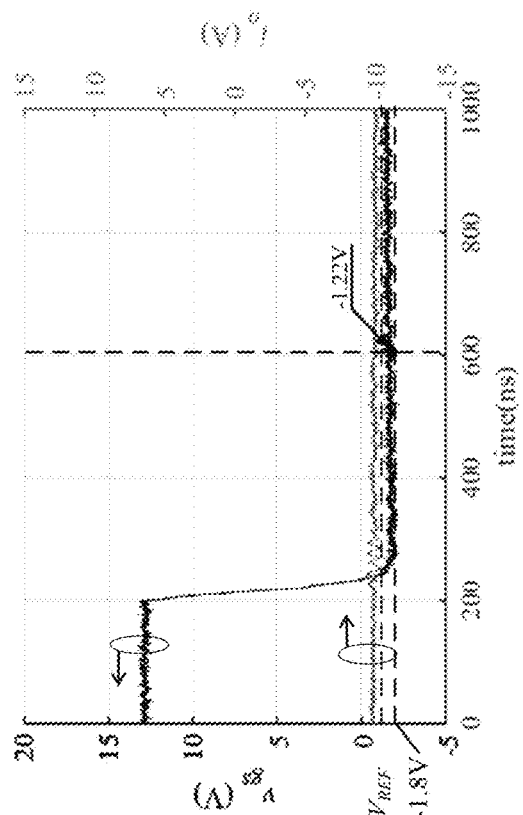
FIG. 22C is a graph showing waveforms of gate-source voltage $v_{gs,2}$ of the switching device M2 in control mode when the inverter output current $i_0$ is at about 10 A and the gate drive circuit is activated.
Figure 22E:
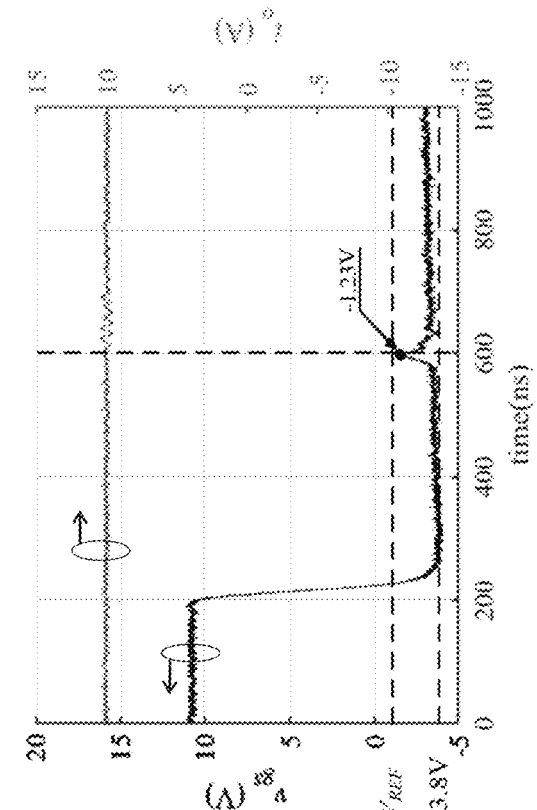
FIG. 22E is a graph showing waveforms of gate-source voltage $v_{gs,2}$ of the switching device M2 in synchronous mode when the inverter output current $i_0$ is at about 10 A and the gate drive circuit is activated.
Figure 22B:
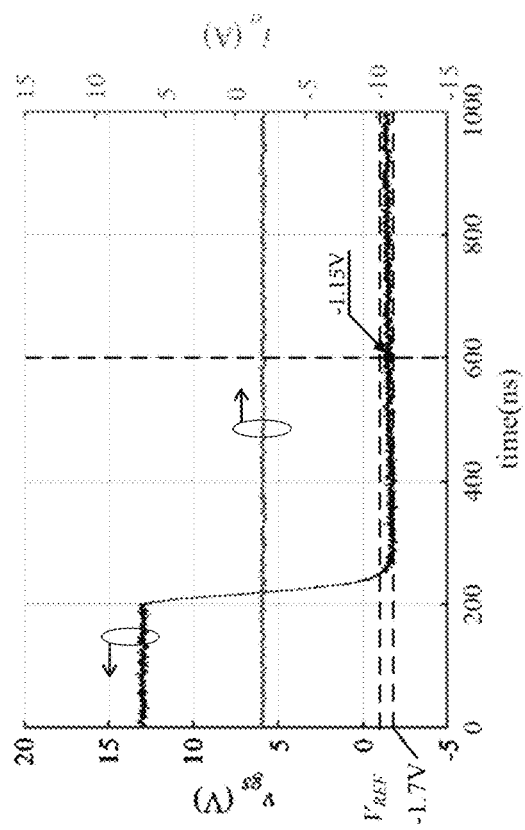
FIG. 22B is a graph showing waveforms of gate-source voltage $v_{gs,2}$ of the switching device M2 in control mode when the inverter output current $i_0$ is at about 2 A and the gate drive circuit is activated.
Figure 22D:
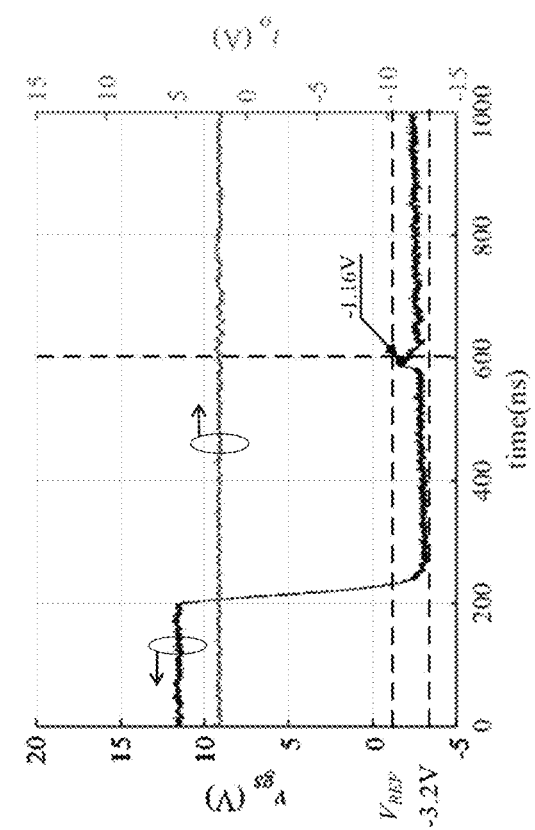
FIG. 22D is a graph showing waveforms of gate-source voltage $v_{gs,2}$ of the switching device M2 in synchronous mode when the inverter output current $i_0$ is at about 2 A and the gate drive circuit is activated.

FIGS. 22A to 22E illustrate corresponding waveforms and with the without the gate driver operating). $R_v$ and thus $v_{gs,2}$ are varied to regulate the off-state peak spurious voltage at $V_{REF}$. FIGS. 22B and 22C show that the gate-source voltage after the dead time, i.e., 400 ns, is regulated at −1V. FIGS. 22D and 22E show the waveforms, when $i_o \cong 2$ A and $i_o \cong 10$ A, respectively, and M2 is in synchronous mode. The peak spurious voltage is $V_{REF}$ in both cases. The magnified waveform of $v_{gs,2}$ with $i_o=2$ A and $i_o=10$ A confirm such voltage regulation control.

The above embodiments of the invention have provided a circuit, e.g., an adaptive gate driver, which can adjust the off-state gate-source voltage to counteract the spurious voltage caused by crosstalk effect. The above embodiments of the invention have provided a circuit, e.g., an adaptive gate driver, that can be used to monitor the health condition of a solid state electronic device (e.g., switch) directly by observing the change of the voltage level. An optimal off-state gate-source voltage for the switch can address the crosstalk issue and can potentially improve the life expectancy of the switch. The technique is evaluated on a 1 kW inverter. By introducing different values of gate-drain capacitance, gate-source resistance, and gate-source capacitance, the results in the above disclosure show that the peak spurious voltage caused by crosstalk is regulated, and that the power loss is less than the driver with a fixed off-state gate-source voltage.

FIG. 23 shows an example data processing system 2300 in one embodiment of the invention. The data processing system 2300 can be used to process data, e.g., measured resistance $R_v$, for determining or facilitate determining of health condition of a solid state electronic device (e.g., the switching device in the above embodiments). The data processing system 2300 generally comprises suitable components necessary to receive, store, and execute appropriate computer instructions, commands, and/or codes. The main components of the data processing system 2300 are a processor 2302 and a memory (storage) 2304. The processor 2302 may include one or more: CPU(s), MCU(s), logic circuit(s), Raspberry Pi chip(s), digital signal processor(s) (DSP), application-specific integrated circuit(s) (ASIC), field-programmable gate array(s) (FPGA), and/or any other digital or analog circuitry/circuitries configured to interpret and/or to execute program instructions and/or to process signals and/or information and/or data. The memory 2304 may include one or more volatile memory (such as RAM, DRAM, SRAM), one or more non-volatile memory (such as ROM, PROM, EPROM, EEPROM, FRAM, MRAM, FLASH, SSD, NAND, NVDIMM), or any of their combinations. Appropriate computer instructions, commands, codes, information and/or data may be stored in the memory 2304. Computer instructions for executing or facilitating executing the method embodiments of the invention may be stored in the memory 2304. The processor 2302 and memory (storage) 2304 may be integrated or separated (and operably connected). A person skilled in the art would appreciate that the data processing system 2300 shown in FIG. 23 is merely an example and that the data processing system 2300 can in other embodiments have different configurations (e.g., include additional components, has fewer components, etc.).

Some embodiments of the invention have provided a circuit that can ensure or guarantee normal operation of a solid state electronic device in a converter/inverter circuit under spurious voltage. Some embodiments of the invention have provided a circuit that can optimize the voltage to extend the lifetime of the solid state electronic device and monitoring the health condition of the solid state electronic device. Some embodiments of the invention can adapt the loading condition of the solid state electronic device (or the converter incorporating the solid state electronic device) to give optimized voltage. Some embodiments of the invention can provide built-in health condition monitoring of the solid state electronic device (or the converter incorporating the solid state electronic device), with requiring extra or substantial components.

The circuit of the invention can be applied to various power electronic circuits and devices, such as solar inverters, power supplies, etc.

It will be appreciated by persons skilled in the art that numerous variations and/or modifications may be made to the invention as shown in the specific embodiments to provide other embodiments of the invention. The described embodiments of the invention should therefore be considered in all respects as illustrative, not restrictive. Example optional features of some aspects of the invention are set forth in the summary section above. Some embodiments of the invention may include one or more of these optional features (some of which are not specifically illustrated in the drawings). Some embodiments of the invention may lack one or more of these optional features (some of which are not specifically illustrated in the drawings). One or more features in one embodiment and one or more features in another embodiment may be combined to provide further embodiment(s) of the invention. For example, the circuit and method of the invention can be applied to other solid state electronic device(s) not limited to MOSFET or SiC MOSFET. For example, the illustrated circuit components can be implemented using equivalent circuit arrangement or components. For example, the signal modulation circuit can be used in different types of converter or inverter circuits with bridge-leg configured solid state electronic devices (two or more). The variable resistance circuit can be implemented using switch(es) and resistors, not necessarily using a digital rheostat or a rheostat.

The invention claimed is:

1. A circuit comprising:
a first solid state electronic device and a second solid state electronic device arranged in a bridge-leg configuration, the first solid state electronic device and the second solid state electronic device being each selectively operable as a control switch and a synchronous switch and each selectively operable in an ON state and an OFF state; a driver circuit operably connected with at least the first solid state electronic device for controlling operation of at least the first solid state electronic device; and
a signal modulation circuit operably connected with or between the driver circuit and the first solid state electronic device, the signal modulation circuit comprising:
an input operably connected with the driver circuit;
an output operably connected with the first solid state electronic device; and
a variable resistance circuit operably connected between the input and the output and operably connected with the driver circuit,
wherein a resistance of the variable resistance circuit is adjustable by the driver circuit to prevent spurious operation of the first solid state electronic device.

2. The circuit of claim 1, wherein the resistance of the variable resistance circuit is adjusted by the driver circuit to affect a signal at the output to prevent spurious activation of the first solid state electronic device when the first solid state electronic device is in the OFF state.

3. The circuit of claim 2, wherein the resistance of the variable resistance circuit is adjusted by the driver circuit to affect a signal at the output to prevent spurious activation of the first solid state electronic device when the first solid state electronic device operates as a synchronous switch and is in the OFF state.

4. The circuit of claim 1, wherein the resistance of the variable resistance circuit is adjustable by the driver circuit to affect a signal at the output to prevent spurious operation of the first solid state electronic device.

5. The circuit of claim 1, wherein the first solid state electronic device comprises a field effect transistor with gate, drain, and source.

6. The circuit of claim 5, wherein the field effect transistor comprises a MOSFET such as SiC MOSFET.

7. The circuit of claim 5,
wherein the driver circuit comprises a gate driver circuit for the field effect transistor; and
wherein the signal modulation circuit is operably connected between the gate driver circuit and the field effect transistor.

8. The circuit of claim 7,
wherein the output of the signal modulation circuit is connected across the gate and source of the field effect transistor.

9. The circuit of claim 7, wherein the driver circuit further comprises:
a detector circuit operable to detect a gate-source voltage of the field effect transistor; and
a control circuit operable to compare the detected gate-source voltage with a reference voltage and to provide a control signal for controlling the resistance of the variable resistance circuit based on the comparison.

10. The circuit of claim 9, wherein the detector circuit comprises an amplifier operably connected with the gate and source of the field effect transistor.

11. The circuit of claim 10, wherein the control circuit comprises:
a comparator operably connected with the amplifier for comparing the detected gate-source voltage with the reference voltage; and
a controller operably connected with the comparator to provide the control signal.

12. The circuit of claim 11, wherein the control circuit further comprises
a latch circuit operably connected with or between the comparator and the controller,
wherein the latch circuit is arranged to be in a first state when it is determined that the detected gate-source voltage is larger than the reference voltage and in a second state when it is determined that the detected gate-source voltage is smaller than the reference voltage;
wherein the controller is arranged to detect a state of the latch circuit and to provide the control signal based on the detected state of the latch circuit.

13. The circuit of claim 12, wherein the controller is arranged to repeatedly detect the state of the latch circuit hence to provide consecutive control signals for dynamically or adaptively adjusting the resistance of the variable resistance circuit.

14. The circuit of claim 12, wherein the controller is arranged to:
provide a first control signal for reducing the resistance of the variable resistance circuit when the latch circuit is detected to be in the first state; and
provide a second control signal for increasing the resistance of the variable resistance circuit when the latch circuit is detected to be in the second state.

15. The circuit of claim 14,
wherein the first control signal is arranged to reduce the resistance of the variable resistance circuit by a predetermined amount; and
wherein the second control signal is arranged to increase the resistance of the variable resistance circuit by a predetermined amount.

16. The circuit of claim 1, wherein the variable resistance circuit comprises a rheostat controllable by the driver circuit to adjust the resistance.

17. The circuit of claim 16, wherein the rheostat comprises a digital rheostat.

18. The circuit of claim 1, wherein the signal modulation circuit comprises:
a first resistor-capacitor circuit;
a second resistor-capacitor circuit; and
a diode circuit;
wherein the variable resistance circuit is part of the second resistor-capacitor circuit.

19. The circuit of claim 18, wherein the diode circuit is operably connected between the first resistor-capacitor circuit and the second resistor-capacitor circuit.

20. The circuit of claim 1, further comprising:
a processor for determining a gate-oxide health condition of the first solid state electronic device based on the resistance of the variable resistance circuit.

21. The circuit of claim 20, further comprising:
a monitoring device or circuit for monitoring resistance of the variable resistance circuit over time; and
wherein the processor is arranged to determine the gate-oxide health condition of the first solid state electronic device based on the monitored resistance of the variable resistance circuit over time.

22. The circuit of claim 1, wherein the circuit comprises a converter circuit or an inverter circuit that includes the first solid state electronic device and the second solid state electronic device.

23. A signal modulation circuit for a solid state electronic device of a circuit,
wherein the circuit comprises:
a first solid state electronic device and a second solid state electronic device arranged in a bridge-leg configuration, the first solid state electronic device and the second solid state electronic device being each selectively operable as a control switch and a synchronous switch and each selectively operable in an ON state and an OFF state; and a driver circuit operably connected with the first solid state electronic device for controlling operation of the first solid state electronic device;
wherein the signal modulation circuit is operably connectable with or between the driver circuit and the first solid state electronic device, and comprises:
an input operably connectable with the driver;
an output operably connectable with the first solid state electronic device; and
a variable resistance circuit operably connected between the input and the output and operably connectable with the driver circuit,
wherein when the signal modulation circuit is operably connected with or between the driver circuit and the first solid state electronic device, a resistance of the variable resistance circuit is adjustable by the driver circuit to prevent spurious operation of the first solid state electronic device; and
wherein the resistance of the variable resistance circuit is usable for determining gate-oxide health condition of the first solid state electronic device.

24. The signal modulation circuit of claim 23, wherein the resistance of the variable resistance circuit is adjustable by the driver circuit to affect a signal at the output to prevent spurious activation of the first solid state electronic device when the first solid state electronic device operates as a synchronous switch and is in the OFF state.

25. The signal modulation circuit of claim 23, wherein the resistance of the variable resistance circuit is adjustable by the driver circuit to affect a signal at the output to prevent spurious operation of the first solid state electronic device.

26. The signal modulation circuit of claim 23, wherein when the signal modulation circuit is operably connected with or between the driver circuit and the first solid state electronic device, the signal modulation circuit is operable to receive from the driver circuit:
a first control signal for reducing the resistance of the variable resistance circuit by a predetermined amount; and
a second control signal for reducing the resistance of the variable resistance circuit by a predetermined amount.

27. The signal modulation circuit of claim 23, wherein the signal modulation circuit comprises:
a first resistor-capacitor circuit;
a second resistor-capacitor circuit; and
a diode circuit operably connected between the first resistor-capacitor circuit and the second resistor-capacitor circuit;
wherein the variable resistance circuit is part of the second resistor-capacitor circuit.

28. The signal modulation circuit of claim 23, wherein the variable resistance circuit comprises a rheostat controllable by the driver circuit to adjust the resistance.

29. The signal modulation circuit of claim 28, wherein the rheostat comprises a digital rheostat.

* * * * *